US012588361B2

(12) United States Patent (10) Patent No.: US 12,588,361 B2
Lee et al. (45) Date of Patent: Mar. 24, 2026

(54) DISPLAY DEVICE

(71) Applicant: Samsung Display Co., Ltd., Yongin-si (KR)

(72) Inventors: Sang Myoung Lee, Yongin-si (KR); Sang Hyun Kang, Yongin-si (KR); Joon Huh, Yongin-si (KR); Seong Hyun Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 375 days.

(21) Appl. No.: 18/468,159

(22) Filed: Sep. 15, 2023

(65) Prior Publication Data

US 2024/0196652 A1 Jun. 13, 2024

(30) Foreign Application Priority Data

Dec. 12, 2022 (KR) ........................ 10-2022-0172223

(51) Int. Cl.
H10K 59/121 (2023.01)
H10K 59/131 (2023.01)
(52) U.S. Cl.
CPC ..... H10K 59/1213 (2023.02); H10K 59/1216 (2023.02); H10K 59/131 (2023.02)
(58) Field of Classification Search
CPC ............. H10K 59/1213; H10K 59/131; H10K 59/1216
See application file for complete search history.

(56) References Cited

U.S. PATENT DOCUMENTS 8,681,077 B2 * 3/2014 Kimura ................ G09G 3/3291
345/55
2017/0309645 A1 10/2017 Yang et al.
2018/0122298 A1 5/2018 Lee et al.
2019/0114967 A1 * 4/2019 Yin .................... H10K 59/1213
2021/0351260 A1 * 11/2021 Kim .................... H10K 59/131

FOREIGN PATENT DOCUMENTS

KR 10-1306206 B1 9/2013
KR 10-1385863 B1 4/2014
WO WO 2017/189360 A1 11/2017

* cited by examiner

*Primary Examiner* — Richard A Booth
(74) *Attorney, Agent, or Firm* — Womble Bond Dickinson (US) LLP

(57) ABSTRACT

A display device includes: a first metal layer on a substrate; an active layer on the first metal layer; a second metal layer on the active layer; a third metal layer on the second metal layer; a first transistor including: a semiconductor region at the active layer; a drain electrode on a first side of the semiconductor region; a source electrode on a second side of the semiconductor region; and a gate electrode at the second metal layer; a first capacitor including: a first capacitor electrode at the first metal layer, and electrically connected to the gate electrode of the first transistor; and a second capacitor electrode integral with the source electrode of the first transistor, and on a third side of the semiconductor region of the first transistor; and a compensation pattern at the active layer, and on a fourth side of the semiconductor region of the first transistor.

20 Claims, 16 Drawing Sheets

MTL1 : CPE11, BE3
ACTL : CPE12, ACT1, CP
MTL2 : GE1
MTL3 : VL, DL3

FIG. 5

MTL1 : CPE11, BE3
ACTL : CPE12, ACT1, CP
MTL2 : GE1
MTL3 : VL, DL3

MTL1 : CPE11, BE3
ACTL : CPE12, ACT1, CP
MTL2 : GE1
MTL3 : VL, DL3

MTL1 : CPE11, BE3
ACTL : CPE12, ACT1, CP
MTL2 : GE1
MTL3 : VL, DL3

MTL1 : GWL, CPE11, BE3, EML, VDDL
ACTL : SE2, CPE12, SE1, ACT1, DE1, SE5, ACT5, DE5
MTL2 : GE1, GE5
MTL3 : CE18, CE22, CE25

DISPLAY DEVICE

CROSS-REFERENCE TO RELATED APPLICATION

This application claims priority to and the benefit of Korean Patent Application No. 10-2022-0172223, filed on Dec. 12, 2022, in the Korean Intellectual Property Office, the entire content of which is incorporated by reference herein.

BACKGROUND

1. Field

Aspects of embodiments of the present disclosure relate to a display device.

2. Description of the Related Art

As information society develops, the demand for display devices for displaying images has increased and diversified. For example, display devices have been applied to various electronic devices, such as smartphones, digital cameras, laptop computers, navigation devices, and smart televisions. The display device may display an image without a back-light unit for providing light to a display panel, because each of the pixels of the display panel includes one or more light emitting elements that may emit light by themselves.

The display device includes a plurality of pixels, data lines and gate lines connected to the plurality of pixels, a data driver for supplying data voltages to the data lines, and a gate driver for supplying gate signals to the gate lines. The data driver and the gate driver may drive the plurality of pixels according to a predetermined frequency.

The above information disclosed in this Background section is for enhancement of understanding of the back-ground of the present disclosure, and therefore, it may contain information that does not constitute prior art.

SUMMARY

One or more embodiments of the present disclosure are directed to a display device capable of stably maintaining a threshold voltage of a first transistor by keeping a parasitic capacitance around the first transistor constant or substantially constant.

However, the aspects and features of the present disclosure are not restricted to those set forth herein. The above and other aspects and features of the present disclosure will become more apparent to those having ordinary skill in the art by referencing the detailed description of the present disclosure given below and the figures.

According to one or more embodiments of the present disclosure, a display device includes: a substrate; a first metal layer on the substrate; an active layer on the first metal layer; a second metal layer on the active layer; a third metal layer on the second metal layer; a first transistor including: a semiconductor region at the active layer; a drain electrode on a first side of the semiconductor region; a source electrode on a second side of the semiconductor region opposite to the first side; and a gate electrode at the second metal layer; a first capacitor including: a first capacitor electrode at the first metal layer, and electrically connected to the gate electrode of the first transistor; and a second capacitor electrode integral with the source electrode of the first transistor, and on a third side of the semiconductor region of the first transistor; and a compensation pattern at the active layer, and on a fourth side of the semiconductor region of the first transistor opposite to the third side.

In an embodiment, the display device may further include a data line extending in a first direction at the third metal layer, and overlapping with the compensation pattern.

In an embodiment, the display device may further include a second transistor including: a semiconductor region at the active layer; a drain electrode at the active layer, and electrically connected to the data line; a source electrode at the active layer, and electrically connected to the gate electrode of the first transistor; and a gate electrode at the second metal layer, and electrically connected to a first gate line.

In an embodiment, the display device may further include: a reference voltage line at the first metal layer, and extending in a second direction crossing the first direction; and a second gate line at the first metal layer, and on a first side of the reference voltage line.

In an embodiment, the display device may further include a third transistor including: a semiconductor region at the active layer; a drain electrode at the active layer, and electrically connected to the reference voltage line; a source electrode at the active layer, and electrically connected to the gate electrode of the first transistor; and a gate electrode at the second metal layer, and electrically connected to the second gate line.

In an embodiment, the display device may further include: an initialization voltage line extending in a second direction crossing the first direction at the first metal layer; and a third gate line on a second side of the initialization voltage line at the first metal layer.

In an embodiment, the display device may further include a fourth transistor including: a semiconductor region at the active layer; a drain electrode at the active layer, and electrically connected to the second capacitor electrode of the first capacitor; a source electrode at the active layer, and electrically connected to the initialization voltage line; and a gate electrode at the second metal layer, and electrically connected to the third gate line.

In an embodiment, the display device may further include: a driving voltage line extending in a second direction crossing the first direction at the first metal layer; and an emission control line on a second side of the driving voltage line at the first metal layer.

In an embodiment, the display device may further include a fifth transistor including: a semiconductor region at the active layer; a drain electrode at the active layer, and electrically connected to the driving voltage line; a source electrode at the active layer, and electrically connected to the drain electrode of the first transistor; and a gate electrode at the second metal layer, and electrically connected to the emission control line.

In an embodiment, the compensation pattern may be electrically connected to the driving voltage line.

According to one or more embodiments of the present disclosure, a display device includes: a substrate; a driving voltage line extending in a first direction at a first metal layer on the substrate; a first transistor on a first side of the driving voltage line, and including: a semiconductor region, a drain electrode, and a source electrode at an active layer on the first metal layer; and a gate electrode at a second metal layer on the first metal layer; a first capacitor on a second side of the first transistor perpendicular to a first side of the first transistor, and including: a first capacitor electrode at the first metal layer, and electrically connected to the gate electrode of the first transistor; and a second capacitor electrode at the active layer, and electrically connected to the source electrode of the first transistor; a voltage line on a second side of the first capacitor at a third metal layer on the second metal layer; and a compensation pattern on a third side of the first transistor opposite to the second side of the first transistor at the active layer, and electrically connected to the driving voltage line.

In an embodiment, the display device may further include a data line extending in a second direction crossing the first direction at the third metal layer, and overlapping with the compensation pattern.

In an embodiment, the display device may further include: a first gate line on the first side of the first transistor at the first metal layer; and a second transistor configured to receive a first gate signal from the first gate line, and electrically connect the data line and the gate electrode of the first transistor to each other.

In an embodiment, the display device may further include: a second gate line on a first side of the first gate line at the first metal layer; and a reference voltage line on a first side of the second gate line at the first metal layer.

In an embodiment, the display device may further include a third transistor configured to receive a second gate signal from the second gate line, and electrically connect the reference voltage line and the gate electrode of the first transistor to each other.

In an embodiment, the display device may further include: a third gate line on a fourth side of the driving voltage line opposite to the first side of the driving voltage line at the first metal layer; and an initialization voltage line on a fourth side of the third gate line at the first metal layer.

In an embodiment, the display device may further include a fourth transistor configured to receive a third gate signal from the third gate line, and electrically connect the source electrode of the first transistor and the initialization voltage line to each other.

In an embodiment, the display device may further include: an emission control line between the driving voltage line and the first transistor at the first metal layer; and a fifth transistor configured to receive an emission signal from the emission control line, and electrically connect the driving voltage line and the drain electrode of the first transistor to each other.

In an embodiment, the display device may further include a second capacitor including: a first capacitor electrode as a portion of the driving voltage line; and a second capacitor electrode at the active layer, and integral with the second capacitor electrode of the first capacitor.

In an embodiment, the display device may further include a bias electrode at the first metal layer, overlapping with the first transistor, and electrically connected to the second capacitor electrode of the first capacitor.

According to one or more embodiments of the present disclosure, a display device may include a compensation pattern disposed on one side of a semiconductor region of a first transistor, such that a parasitic capacitance around the first transistor may be kept constant or substantially constant even though the first transistor or a bias electrode is mis-aligned, and thus, a threshold voltage of the first transistor may be stably maintained.

However, the aspects and features of the present disclosure are not limited to those described above, and various other aspects and features may be included in the present specification as would be appreciated by those having ordinary skill in the art.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 5 is a waveform diagram of signals supplied to the pixel illustrated in FIG. 4;

DETAILED DESCRIPTION

Figure 1:
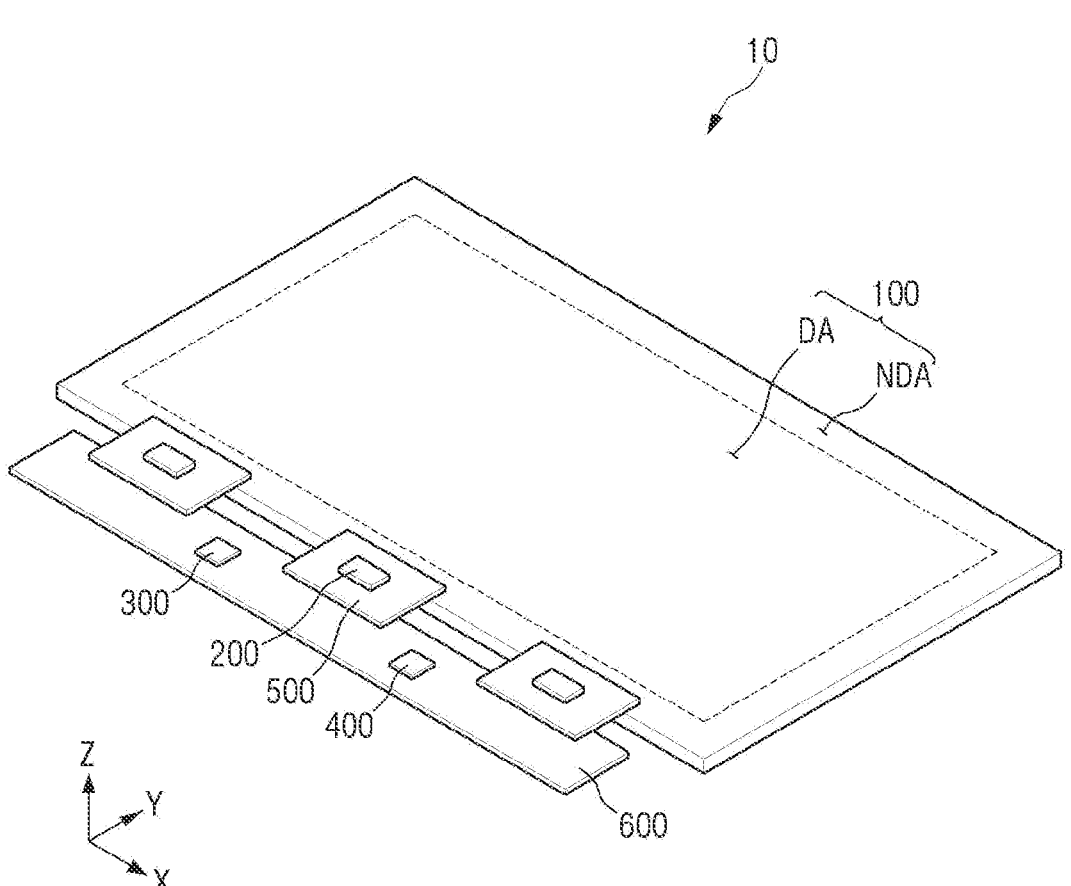
FIG. 1 is a perspective view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, and/or the like of the elements, unless otherwise specified.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect the actual shapes of the regions of a device, and as such, are not necessarily intended to be limiting.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein, and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the spirit and scope of the present disclosure. Further, the blocks, units, parts, and/or modules of some embodiments may be physically combined into more complex blocks, units, parts, and/or modules, without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device according to an embodiment.

Referring to FIG. 1, a display device 10 is a device that displays a moving image or a still image. The display device 10 may be used as a display screen of various suitable products, such as televisions, laptop computers, monitors, billboards, and Internet of Things (IOT) devices, as well as various suitable portable electronic devices, such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device 10 may include a display panel 100, display drivers 200, a timing controller 300, a power supply unit (e.g., a power supply) 400, data circuit boards 500, and a control circuit board 600.

The display panel 100 may have a rectangular shape in a plan view, having long sides extending in a first direction (e.g., the X-axis direction), and short sides extending in a second direction (e.g., the Y-axis direction) crossing the first direction (e.g., the X-axis direction). A corner where the long side extending in the first direction (e.g., the X-axis direction) and the short side extending in the second direction (e.g., the Y-axis direction) meet each other may be rounded with a suitable curvature (e.g., a predetermined curvature), or may be right-angled. The shape of the display panel 100 in a plan view is not limited to the rectangular shape, and may be another suitable polygonal shape, a circular shape, or an elliptical shape. The display panel 100 may be formed to be flat or substantially flat, but the present disclosure is not limited thereto. For example, the display panel 100 may include curved surface parts formed at left and right ends thereof, and having a constant curvature or a variable curvature. The display panel 100 may be flexibly formed to be curved, bent, folded, or rolled.

The display panel 100 may include a display area DA for displaying an image, and a non-display area NDA disposed around (e.g., adjacent to) the display area DA. The display area DA may occupy most of the area of the display panel 100. The display area DA may be disposed at the center of the display panel 100. The display area DA may include a plurality of pixels for displaying an image.

Each of the plurality of pixels may include a light emitting element for emitting light. The light emitting element may include at least one of an organic light emitting diode (LED) including an organic light emitting layer, a quantum dot LED including a quantum dot light emitting layer, an inorganic LED including an inorganic semiconductor, or a micro LED, but the present disclosure is not limited thereto.

The non-display area NDA may be disposed to be adjacent to the display area DA. The non-display area NDA may be an area outside the display area DA. The non-display area NDA may be disposed to surround (e.g., around a periphery of) the display area DA. The non-display area NDA may be an edge area of the display panel 100.

The non-display area NDA may include gate drivers, fan-out lines, and pad parts. The gate drivers may supply gate signals to gate lines of the display area DA. The fan-out lines may electrically connect the display drivers 200 and data lines of the display area DA to each other. The pad parts may be electrically connected to the data circuit boards 500. For example, the pad parts may be disposed at an edge of one side of the display panel 100, and the gate drivers may be disposed at an edge of another side of the display panel 100 that is adjacent to the edge of the one side of the display panel 100, but the present disclosure is not limited thereto.

The display drivers 200 may output signals and voltages for driving the display panel 100. The display drivers 200 may supply data voltages to the data lines. The display drivers 200 may supply source voltages to power lines, and may supply gate control signals to the gate drivers. The display driver 200 may be formed as an integrated circuit (IC), and mounted on the data circuit board 500 in a chip on film (COF) manner. As another example, the display driver 200 may be mounted on the non-display area NDA of the display panel 100 in a chip on glass (COG) manner, a chip on plastic (COP) manner, or an ultrasonic bonding manner.

The timing controller 300 may be mounted on the control circuit board 600, and may receive digital video data and a timing synchronization signal supplied from a display driving system or a graphic device through a user connector provided on the control circuit board 600. The timing controller 300 may align the digital video data to be suitable for a pixel arrangement structure based on the timing synchronization signal, and may supply the aligned digital video data to the display drivers 200. The timing controller 300 may generate data control signals and gate control signals based on the timing synchronization signal. The timing controller 300 may control supply timings of the data voltages of the display drivers 200 based on the data control signals, and control supply timings of the gate signals of the gate drivers based on the gate control signals.

The power supply unit 400 may be mounted on the control circuit board 600, and may supply source voltages to the display panel 100 and the display drivers 200. For example, the power supply unit 400 may generate a driving voltage, a low potential voltage, and/or an initialization voltage. The power supply unit 400 may supply the source voltages to drive the plurality of pixels and the display drivers 200.

The data circuit boards 500 may be disposed on the pad parts disposed at the edge of the one side of the display panel 100. The data circuit boards 500 may be attached to the pad parts using conductive adhesive members, such as anisotropic conductive films. The data circuit boards 500 may be electrically connected to signal lines of the display panel 100 through the anisotropic conductive films. The display panel 100 may receive the data voltages and the driving voltage from the data circuit boards 500. For example, the data circuit board 500 may be a flexible printed circuit board, a printed circuit board, or a flexible film, such as a chip on film.

The control circuit board 600 may be attached to the data circuit boards 500 using an anisotropic conductive film, a low-resistance and high-reliability material, such as a self-assembly anisotropic conductive paste (SAP), or the like. The control circuit board 600 may be electrically connected to the data circuit boards 500. The control circuit board 600 may be a flexible printed circuit board or a printed circuit board.

Figure 2:
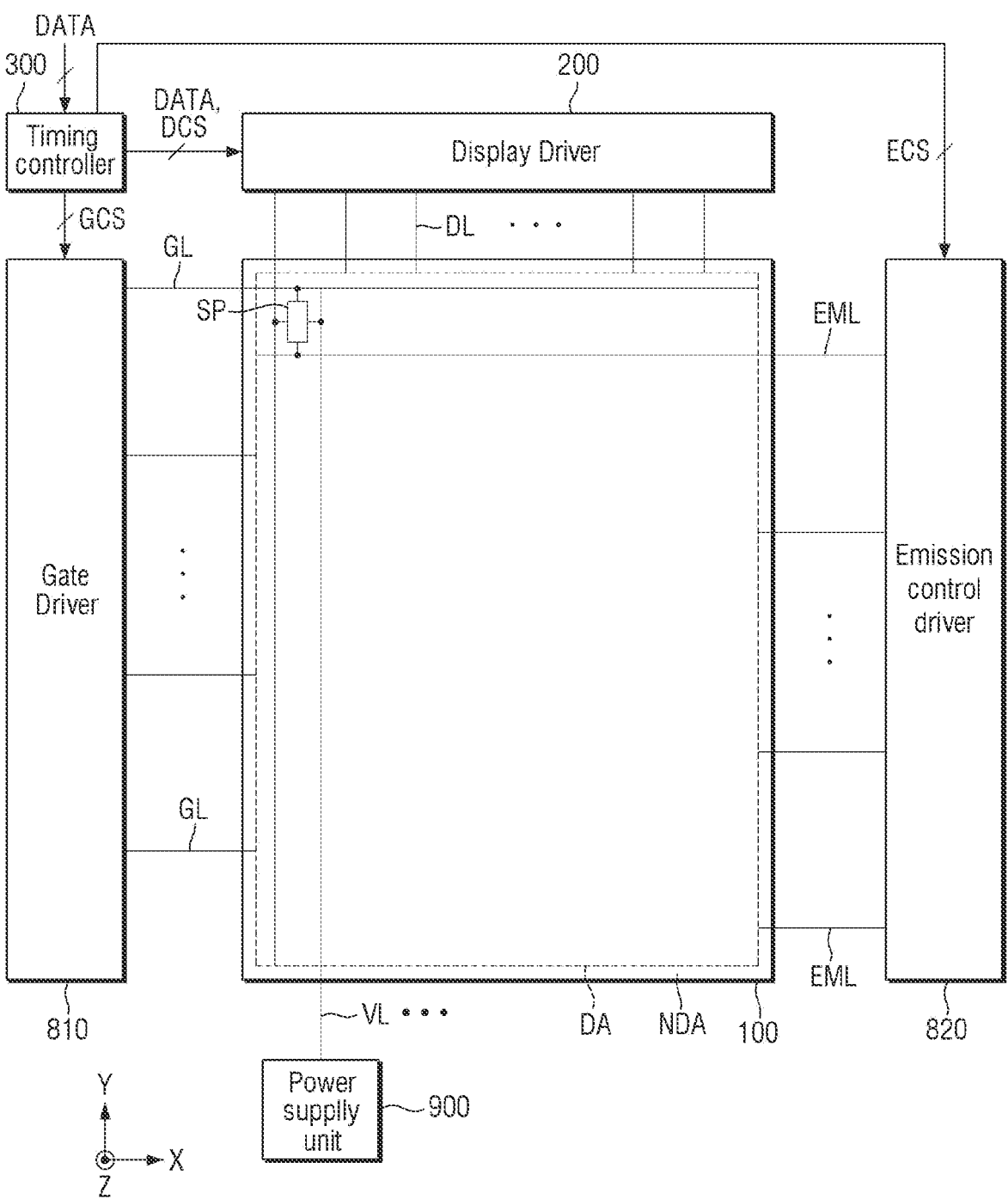
FIG. 2 is a block diagram illustrating the display device according to an embodiment.

FIG. 2 is a block diagram illustrating the display device according to an embodiment.

Referring to FIG. 2, the display panel 100 may include the display area DA and the non-display area NDA.

The display area DA may include a plurality of pixels SP, and a plurality of voltage lines VL, a plurality of gate lines GL, a plurality of emission control lines EML, and a plurality of data lines DL that are connected to the plurality of pixels SP.

Each of the plurality of pixels SP may be connected to a corresponding gate line GL, a corresponding data line DL, a corresponding emission control line EML, and a corresponding voltage line VL. Each of the plurality of pixels SP may include at least one transistor, a light emitting element, and a capacitor.

The gate lines GL may extend in the X-axis direction, and may be spaced apart from each other in the Y-axis direction crossing the X-axis direction. The gate lines GL may sequentially supply gate signals to the plurality of pixels SP.

The emission control lines EML may extend in the X-axis direction, and may be spaced apart from each other in the Y-axis direction. The emission control lines EML may sequentially supply emission signals to the plurality of pixels SP.

The data lines DL may extend in the Y-axis direction, and may be spaced apart from each other in the X-axis direction. The data lines DL may supply data voltages to the plurality of pixels SP. The data voltages may determine luminances of each of the plurality of pixels SP.

The voltage lines VL may extend in the Y-axis direction, and may be spaced apart from each other in the X-axis direction. The voltage lines VL may supply source voltages to the plurality of pixels SP. The source voltages may include at least one of a driving voltage, an initialization voltage, a reference voltage, or a common voltage. For example, the driving voltage may be a high potential voltage for driving the light emitting element of the pixel SP, and the common voltage may be a low potential voltage for driving the light emitting element of the pixel SP.

The display driver 200 may convert digital video data DATA into analog data voltages, and may supply the analog data voltages to the data lines DL through fan-out lines. Gate signals of a gate driver 810 may select pixels SP to which the data voltages are supplied, and the selected pixels SP may receive the data voltages through the data lines DL.

The timing controller 300 may receive digital video data DATA and timing signals from a graphic device. For example, the graphic device may be a graphic card of the display device 10 (e.g., see FIG. 1), but the present disclosure is not limited thereto. The timing controller 300 may control an operation timing of the display driver 200 by generating a data control signal DCS based on the timing signals, may control an operation timing of the gate driver 810 by generating a gate control signal GCS based on the timing signals, and may control an operation timing of an emission control driver 820 by generating an emission control signal ECS based on the timing signals. The timing controller 300 may supply the gate control signal GCS to the gate driver 810. The timing controller 300 may supply the emission control signal ECS to the emission control driver 820. The timing controller 300 may supply the digital video data DATA and the data control signal DCS to the display driver 200.

The power supply unit 400 may be disposed on the control circuit board 600 (e.g., see FIG. 1), and may supply source voltages to the display drivers 200 and the display panel 100. The power supply unit 400 may generate a driving voltage, and may supply the driving voltage to a driving voltage line. The power supply unit 400 may generate an initialization voltage, and may supply the initialization voltage to an initialization voltage line. The power supply unit 400 may generate a reference voltage, and may supply the reference voltage to a reference voltage line. The power supply unit 400 may generate a common voltage, and may supply the common voltage to a common electrode that is common to the light emitting elements of the plurality of pixels SP.

The gate driver 810 may be disposed outside of one side of the display area DA, or on one side of the non-display area NDA. The emission control driver 820 may be disposed outside of another side (e.g., an opposite side) of the display area DA, or on another side (e.g., an opposite side) of the non-display area NDA. However, the present disclosure is not limited thereto. As another example, the gate driver 810 and the emission control driver 820 may be disposed on either one side or the other side of the non-display area NDA.

The gate driver 810 may include a plurality of transistors for generating gate signals based on the gate control signal GCS. The emission control driver 820 may include a plurality of transistors for generating emission signals based on the emission control signal ECS. For example, the transistors of the gate driver 810 and the transistors of the emission control driver 820 may be formed at (e.g., in or on) the same layer as that of the transistors of each of the pixels SP. The gate driver 810 may supply the gate signals to the gate lines GL, and the emission control driver 820 may supply the emission signals to the emission control lines EML.

Figure 3:
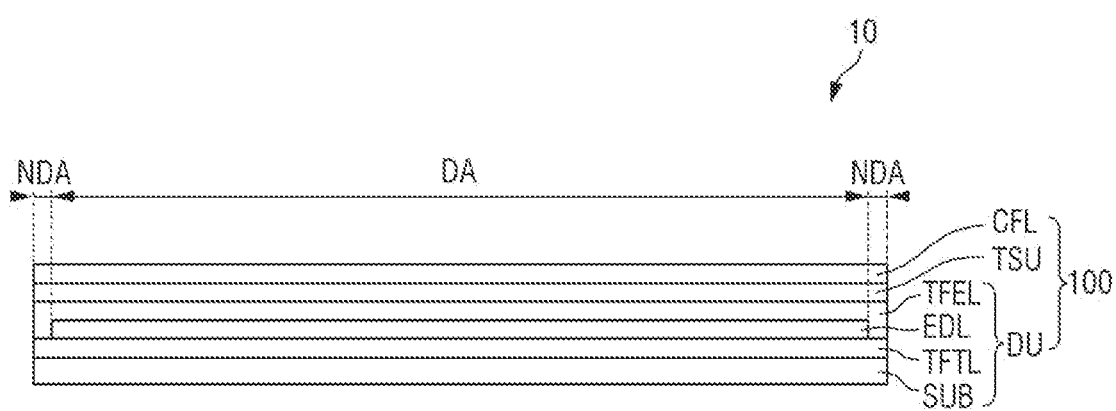
FIG. 3 is a cross-sectional view illustrating the display device according to an embodiment.
Figure 3:
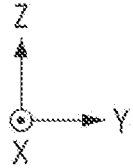

FIG. 3 is a cross-sectional view illustrating the display device according to an embodiment.

Referring to FIG. 3, the display panel 100 may include a display unit (e.g., a display layer) DU, a touch sensing unit (e.g., a touch sensing layer) TSU, and a color filter layer CFL. The display unit DU may include a substrate SUB, a thin film transistor layer TFTL, a light emitting element layer EDL, and an encapsulation layer TFEL.

The substrate SUB may be a base substrate or a base member. The substrate SUB may be a flexible substrate that may be bent, folded, and/or rolled. As an example, the substrate SUB may include a polymer resin such as polyimide (PI), but the present disclosure is not limited thereto. As another example, the substrate SUB may include a glass material or a metal material.

The thin film transistor layer TFTL may be disposed on the substrate SUB. The thin film transistor layer TFTL may include a plurality of thin film transistors constituting pixel circuits of the pixels. The thin film transistor layer TFTL may further include gate lines, data lines, power lines, gate control lines, fan-out lines connecting the display driver 200 and the data lines to each other, and lead lines connecting the display driver 200 and the pad parts to each other. Each of the thin film transistors may include a semiconductor region, a source electrode, a drain electrode, and a gate electrode. For example, when the gate driver is formed on one side of the non-display area NDA of the display panel 100, the gate driver may include a plurality of thin film transistors.

The thin film transistor layer TFTL may be disposed in the display area DA and the non-display area NDA. The thin film transistors of each of the pixels, the gate lines, the data lines, and the power lines of the thin film transistor layer TFTL may be disposed in the display area DA. The gate control lines and the fan-out lines of the thin film transistor layer TFTL may be disposed in the non-display area NDA.

The light emitting element layer EDL may be disposed on the thin film transistor layer TFTL. The light emitting element layer EDL may include a plurality of light emitting elements, in which a pixel electrode, a light emitting layer, and a common electrode are sequentially stacked to emit light, and a pixel defining film defining the pixels. The plurality of light emitting elements of the light emitting element layer EDL may be disposed in the display area DA.

For example, the light emitting layer may be an organic light emitting layer including an organic material. The light emitting layer may include a hole transporting layer, an organic light emitting layer, and an electron transporting layer. When the pixel electrode receives a suitable voltage (e.g., a predetermined voltage) through a thin film transistor of the thin film transistor layer TFTL, and the common electrode receives a cathode voltage, holes and electrons may move to the organic light emitting layer through the hole transporting layer and the electron transporting layer, respectively, and may be combined with each other in the organic light emitting layer to emit light. For example, the pixel electrode may be an anode electrode and the common electrode may be a cathode electrode, but the present disclosure is not limited thereto.

As another example, the plurality of light emitting elements may include quantum dot light emitting diodes including a quantum dot light emitting layer, inorganic light emitting diodes including an inorganic semiconductor, or micro light emitting diodes.

The encapsulation layer TFEL may cover an upper surface and side surfaces of the light emitting element layer EDL, and may protect the light emitting element layer EDL. The encapsulation layer TFEL may include at least one inorganic film and at least one organic film for encapsulating the light emitting element layer EDL.

The touch sensing unit TSU may be disposed on the encapsulation layer TFEL. The touch sensing unit TSU may include a plurality of touch electrodes for sensing a user's touch in a capacitance manner, and touch lines connecting the plurality of touch electrodes and a touch driver to each other. As an example, the touch sensing unit TSU may sense the user's touch in a mutual capacitance manner or a self-capacitance manner.

As another example, the touch sensing unit TSU may be disposed on a separate substrate that is disposed on the display unit DU. In this case, the substrate supporting the touch sensing unit TSU may be a base member encapsulating the display unit DU.

The plurality of touch electrodes of the touch sensing unit TSU may be disposed in a touch sensor area overlapping with the display area DA. The touch lines of the touch sensing unit TSU may be disposed in a touch peripheral area overlapping with the non-display area NDA.

The color filter layer CFL may be disposed on the touch sensing unit TSU. The color filter layer CFL may include a plurality of color filters, each corresponding to one or more of a plurality of emission areas. Each of the color filters may selectively transmit light of a suitable wavelength (e.g., a specific or predetermined wavelength) therethrough, and block or absorb light of other wavelengths. The color filter layer CFL may absorb some of the light introduced from the outside of the display device 10 to reduce reflected light by external light. Accordingly, the color filter layer CFL may prevent or substantially prevent distortion of colors due to external light reflection.

Because the color filter layer CFL is directly disposed on the touch sensing unit TSU, the display device 10 may not use a separate substrate for the color filter layer CFL. Accordingly, a thickness of the display device 10 may be relatively decreased.

Figure 4:
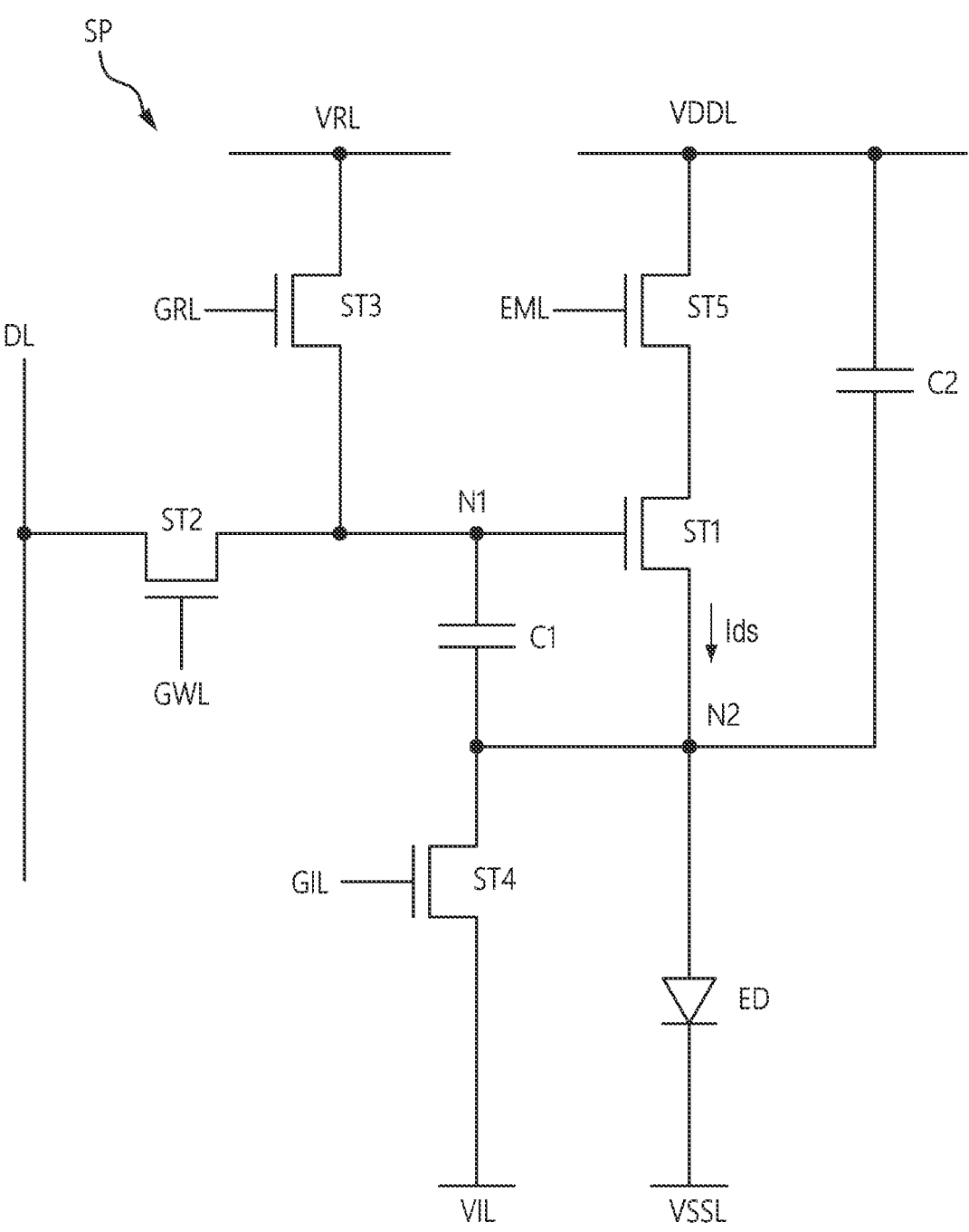
FIG. 4 is a circuit diagram illustrating a pixel of the display device according to an embodiment.
Figure 5:
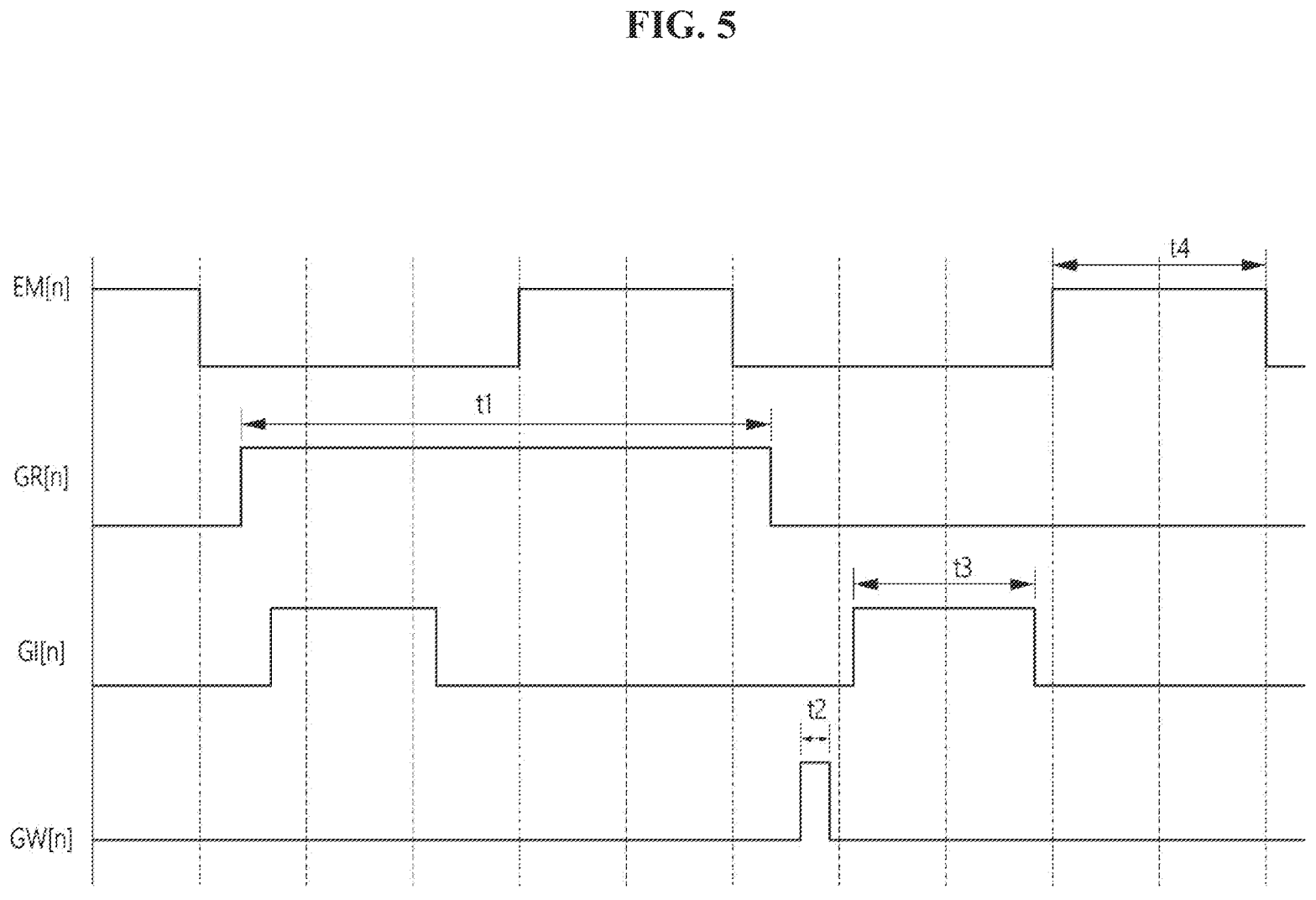

FIG. 4 is a circuit diagram illustrating a pixel of the display device according to an embodiment, and FIG. 5 is a waveform diagram of signals supplied to the pixel illustrated in FIG. 4.

Referring to FIGS. 4 and 5, the display panel 100 may include the plurality of pixels SP (e.g., see FIG. 2) arranged along p rows (where p is a positive integer) and q columns (where q is a positive integer). Each of the plurality of pixels SP may be connected to a corresponding first gate line GWL, a corresponding second gate line GRL, a corresponding third gate line GIL, a corresponding emission control line EML, a corresponding data line DL, a reference voltage line VRL, a driving voltage line VDDL, an initialization voltage line VIL, and a low potential line VSSL.

The pixel SP may include a pixel circuit and a light emitting element ED. The pixel circuit may include a first transistor ST1, a second transistor ST2, a third transistor ST3, a fourth transistor ST4, a fifth transistor ST5, a first capacitor C1, and a second capacitor C2.

The first transistor ST1 may include a gate electrode, a source electrode, and a drain electrode. The first transistor ST1 may control a drain-source current (e.g., a driving current) Ids according to a data voltage applied to the gate electrode thereof. The driving current Ids flowing through a channel of the first transistor ST1 may be proportional to the square of a difference between a voltage Vgs between the gate electrode and the source electrode of the first transistor ST1 and a threshold voltage Vth of the first transistor ST1 (e.g., $Ids=k\times(Vgs-Vth)^2$). Here, k refers to a proportional coefficient determined by a structure and physical properties of the first transistor ST1, Vgs refers to a gate-source voltage of the first transistor ST1, and Vth refers to the threshold voltage of the first transistor ST1.

The light emitting element ED may receive the driving current Ids to emit light. A light emission amount or luminance of the light emitting element ED may be proportional to a magnitude of the driving current Ids.

The light emitting element ED may be an organic light emitting diode including a first electrode, a second electrode, and an organic light emitting layer disposed between the first electrode and the second electrode. As another example, the light emitting element ED may be an inorganic light emitting element including a first electrode, a second electrode, and an inorganic semiconductor disposed between the first electrode and the second electrode. As another example, the light emitting element ED may be a quantum dot light emitting element including a first electrode, a second electrode, and a quantum dot light emitting layer disposed between the first electrode and the second electrode. As another example, the light emitting element ED may be a micro light emitting diode.

The first electrode of the light emitting element ED may be connected to a second node N2. The first electrode of the light emitting element ED may be connected to the source electrode of the first transistor ST1, a drain electrode of the fourth transistor ST4, a second capacitor electrode of the first capacitor C1, and a second capacitor electrode of the second capacitor C2 through the second node N2. The second electrode of the light emitting element ED may be connected to the low potential line VSSL. The second electrode of the light emitting element ED may receive a low potential voltage from the low potential line VSSL.

The second transistor ST2 may be turned on by a first gate signal GW[n] of the first gate line GWL to electrically connect the data line DL and a first node N1 to each other, the first node N1 being the gate electrode of the first transistor ST1. The second transistor ST2 may be turned on based on the first gate signal GW[n] to supply a data voltage to the first node N1. A gate electrode of the second transistor ST2 may be electrically connected to the first gate line GWL, a drain electrode of the second transistor ST2 may be electrically connected to the data line DL, and a source electrode of the second transistor ST2 may be electrically connected to the first node N1.

The third transistor ST3 may be turned on by a second gate signal GR[n] of the second gate line GRL to electrically connect the reference voltage line VRL and the first node N1 to each other, the first node N1 being the gate electrode of the first transistor ST1. The third transistor ST3 may be turned on based on the second gate signal GR[n] to supply a reference voltage to the first node N1. A gate electrode of the third transistor ST3 may be electrically connected to the second gate line GRL, a drain electrode of the third transistor ST3 may be electrically connected to the reference voltage line VRL, and a source electrode of the third transistor ST3 may be electrically connected to the first node N1.

The fourth transistor ST4 may be turned on by a third gate signal GI[n] of the third gate line GIL to electrically connect the second node N2, which is the source electrode of the first transistor ST1, and the initialization voltage line VIL to each other. The fourth transistor ST4 may be turned on based on the third gate signal GI[n] to discharge the first electrode of the light emitting element ED to an initialization voltage. A gate electrode of the fourth transistor ST4 may be electrically connected to the third gate line GIL, the drain electrode of the fourth transistor ST4 may be electrically connected to the second node N2, and a source electrode of the fourth transistor ST4 may be electrically connected to the initialization voltage line VIL.

The fifth transistor ST5 may be turned on by an emission signal EM[n] of the emission control line EML to electrically connect the driving voltage line VDDL and the drain electrode of the first transistor ST1 to each other. A gate electrode of the fifth transistor ST5 may be electrically connected to the emission control line EML, a drain electrode of the fifth transistor ST5 may be electrically connected to the driving voltage line VDDL, and a source electrode of the fifth transistor ST5 may be electrically connected to the drain electrode of the first transistor ST1. When both the fifth transistor ST5 and the first transistor ST1 are turned on, the driving current Ids may be supplied to the light emitting element ED.

Each of the first transistor ST1, the second transistor ST2, the third transistor ST3, the fourth transistor ST4, and the fifth transistor ST5 may include an oxide-based active layer. The first to fifth transistors ST1, ST2, ST3, ST4, and ST5 may have a coplanar structure in which the gate electrodes thereof are disposed at upper portions thereof. The first to fifth transistors ST1, ST2, ST3, ST4, and ST5 may correspond to n-type transistors, and may output currents flowing into the drain electrodes to the source electrodes based on gate high voltages (e.g., gate-on voltages) applied to the gate electrodes. The oxide-based active layer may have a relatively small S-factor, may increase a constant current driving region in a low gradation region, and may improve a low gradation expression.

As another example, each of the first transistor ST1, the second transistor ST2, the third transistor ST3, the fourth transistor ST4, and the fifth transistor ST5 may include an active layer including (e.g., made of) low temperature polycrystalline silicon (LTPS). The first to fifth transistors ST1, ST2, ST3, ST4, and ST5 may correspond to p-type transistors, and may output currents flowing into the source electrodes to the drain electrodes based on gate low voltages (e.g., gate-on voltages) applied to the gate electrodes.

The first capacitor C1 may be electrically connected between the first node N1, which is the gate electrode of the first transistor ST1, and the second node N2, which is the source electrode of the first transistor ST1. For example, a first capacitor electrode of the first capacitor C1 is electrically connected to the first node N1, and the second capacitor electrode of the first capacitor C1 is electrically connected to the second node N2, such that a potential difference between the gate electrode and the source electrode of the first transistor ST1 may be maintained or substantially maintained.

The second capacitor C2 may be electrically connected between the driving voltage line VDDL and the second node N2, which is the source electrode of the first transistor ST1. For example, a first capacitor electrode of the second capacitor C2 is electrically connected to the driving voltage line VDDL, and the second capacitor electrode of the second capacitor C2 is electrically connected to the second node N2, such that a potential difference between the driving voltage line VDDL and the source electrode of the first transistor ST1 may be maintained or substantially maintained.

Referring to FIG. 5 in conjunction with FIG. 4, the display device 10 may be driven at a desired driving frequency (e.g., a predetermined driving frequency), and one frame period may include first to fourth periods t1 to t4.

The third transistor ST3 may receive the second gate signal GR[n] having a gate-on level (e.g., a high level) during the first period t1. The third transistor ST3 may be turned on based on the second gate signal GR[n] having the gate-on level (e.g., the high level), and may supply the reference voltage to the first node N1, which is the gate electrode of the first transistor ST1.

The second transistor ST2 may receive the first gate signal GW[n] having a gate-on level (e.g., a high level) during the second period t2. The second transistor ST2 may be turned on based on the first gate signal GW[n] having the gate-on level (e.g., the high level), and may supply the data voltage to the first node N1, which is the gate electrode of the first transistor ST1.

The fourth transistor ST4 may receive the third gate signal GI[n] having a gate-on level (e.g., a high level) during third period t3. The fourth transistor ST4 may be turned on based on the third gate signal GI[n] having the gate-on level (e.g., the high level), and may discharge the second node N2, which is the source electrode of the first transistor ST1, to the initialization voltage.

When the gate electrode of the first transistor ST1 receives the data voltage Vdata, the gate-source voltage Vgs of the first transistor ST1 may correspond to a difference voltage (e.g., Vdata−Vin) between the data voltage Vdata and the initialization voltage Vin, and may be greater than the threshold voltage Vth (e.g., Vdata−Vin>=Vth), such that the first transistor ST1 may be turned on. Accordingly, the drain-source current Ids of the first transistor ST1 may be determined according to the data voltage Vdata, the initialization voltage Vin, and the threshold voltage Vth of the first transistor ST1 (e.g., $Ids=k \times (Vdata-Vin-Vth)^2$). The first transistor ST1 may supply the drain-source current Ids to the second node N2 until the gate-source voltage Vgs reaches the threshold voltage Vth of the first transistor ST1. As such, while the first transistor ST1 is turned on, a voltage of the second node N2 and the drain-source current Ids of the first transistor ST1 may be changed, and the voltage of the second node N2 may eventually converge to a difference voltage (e.g., Vdata−Vth) between the data voltage Vdata and the threshold voltage Vth of the first transistor ST1.

The emission signal EM[n] may have a gate-on level (e.g., a high level) during the fourth period t4. When the emission signal EM[n] has the gate-on level (e.g., the high level), the fifth transistor ST5 may be turned on while the first transistor ST1 is turned on to supply the driving current to the light emitting element ED.

Figure 6:
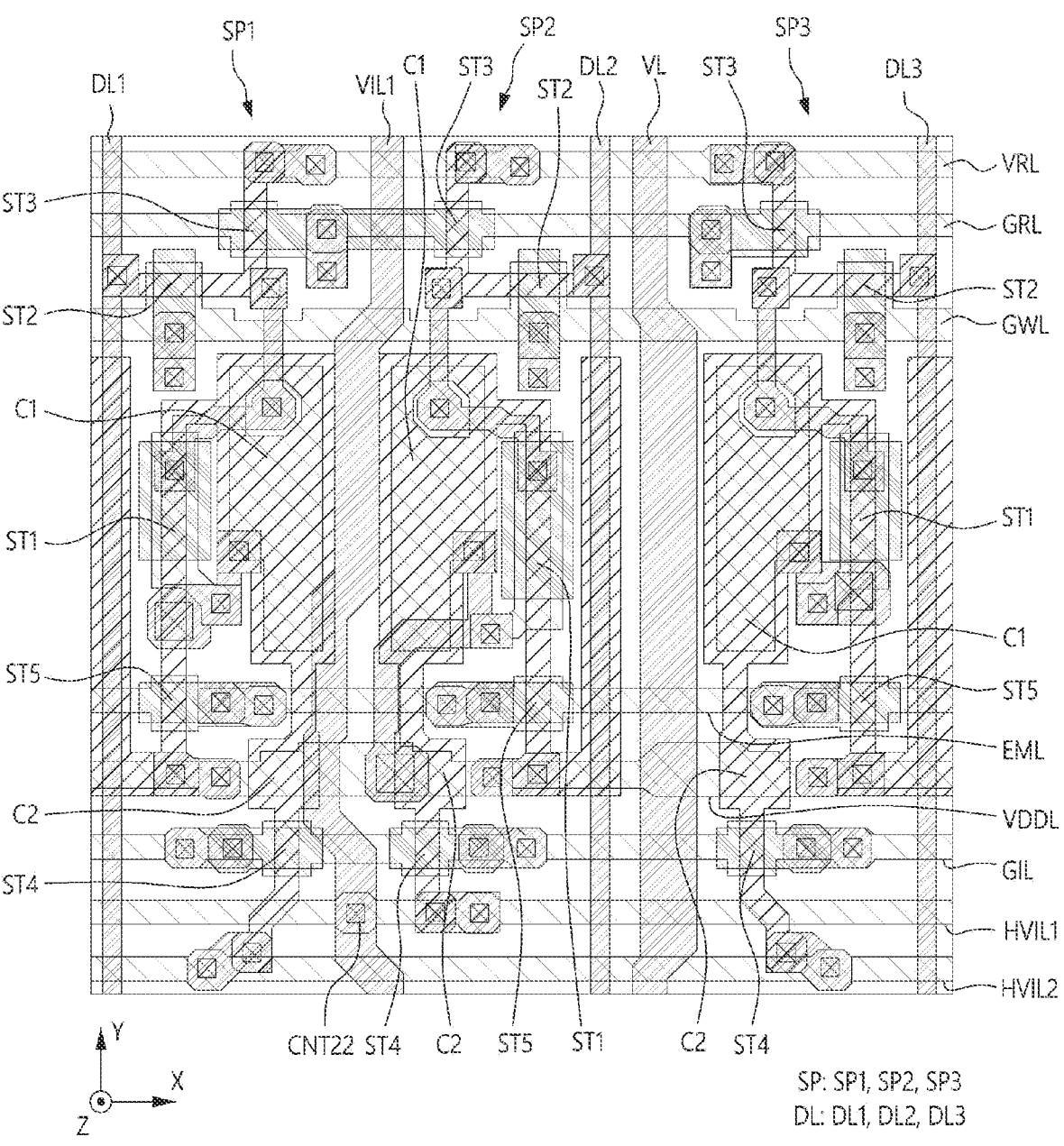
FIG. 6 is a plan view illustrating a pixel of the display device according to an embodiment.
Figure 7:
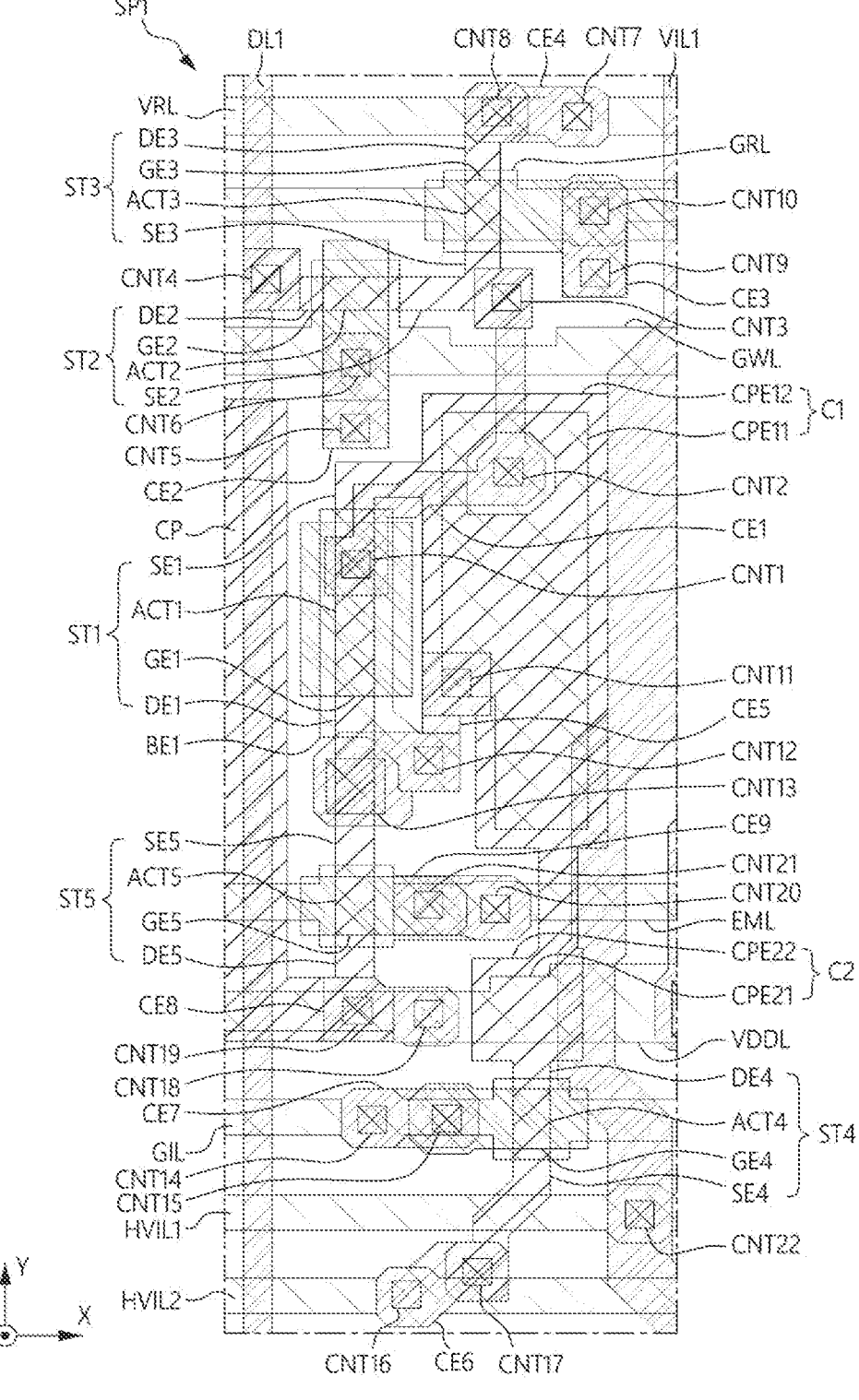
FIG. 7 is a plan view illustrating a first pixel illustrated in FIG. 6.
Figure 8:
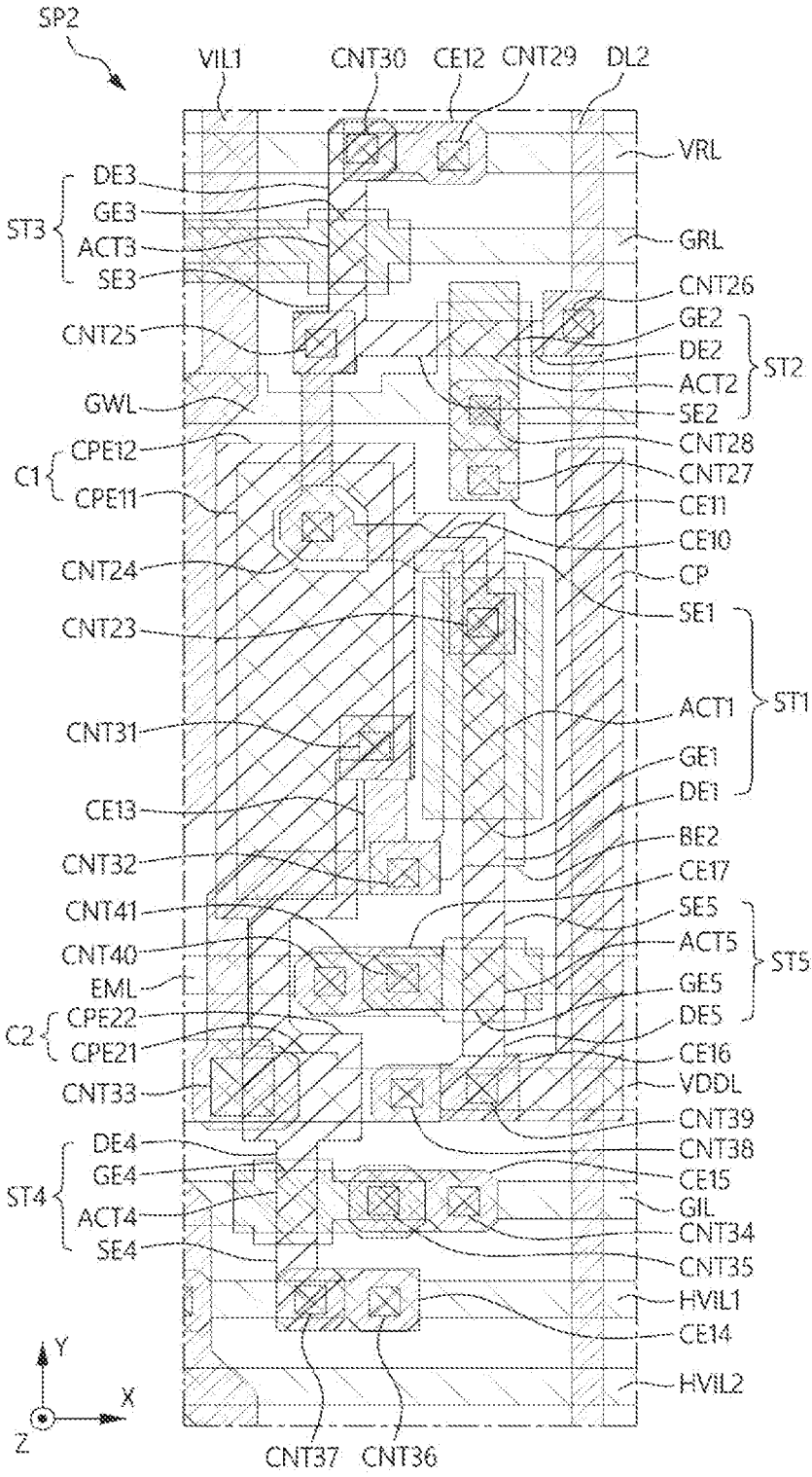
FIG. 8 is a plan view illustrating a second pixel illustrated in FIG. 6.
Figure 9:
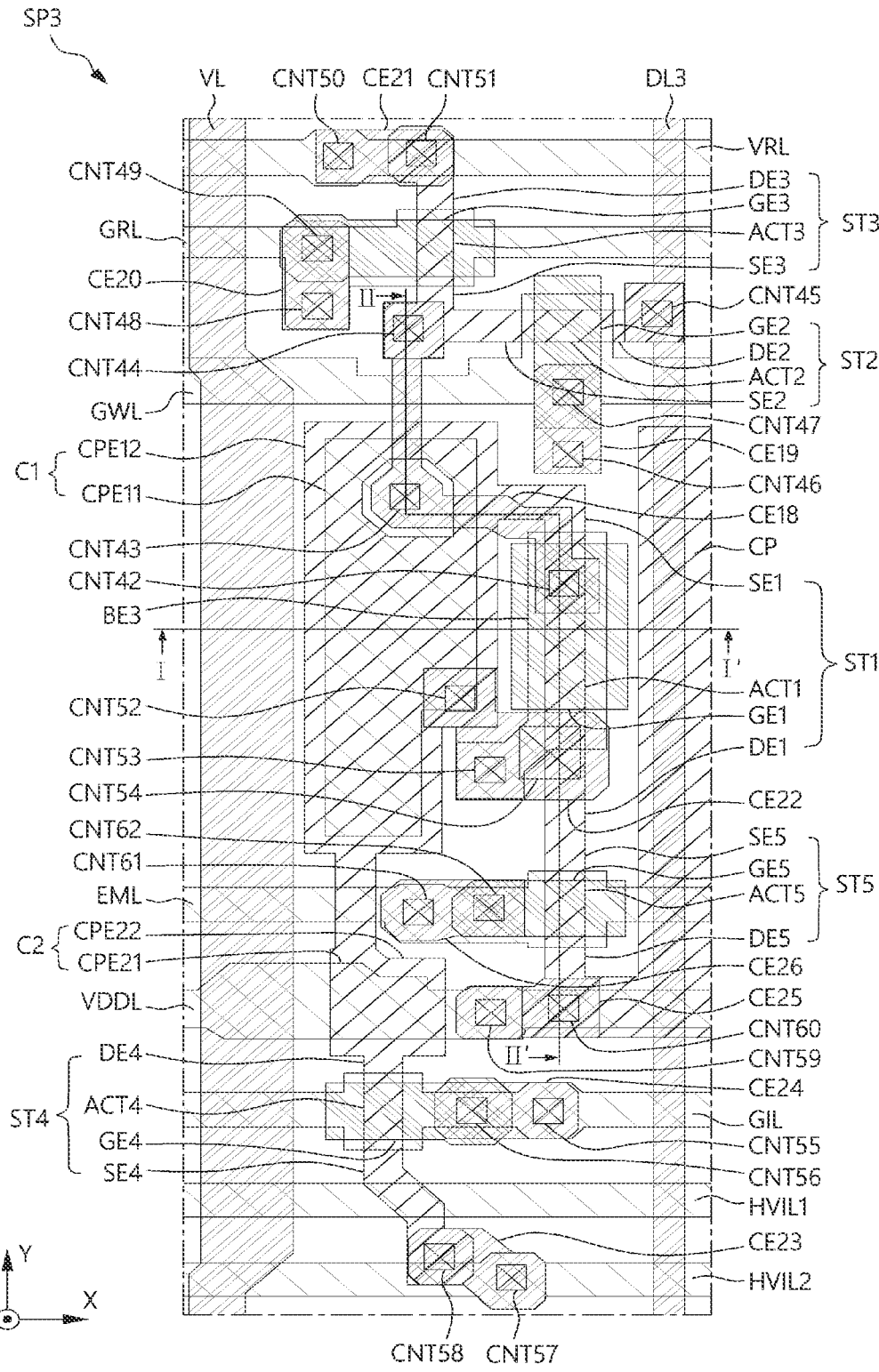
FIG. 9 is a plan view illustrating a third pixel illustrated in FIG. 6.
Figure 10:
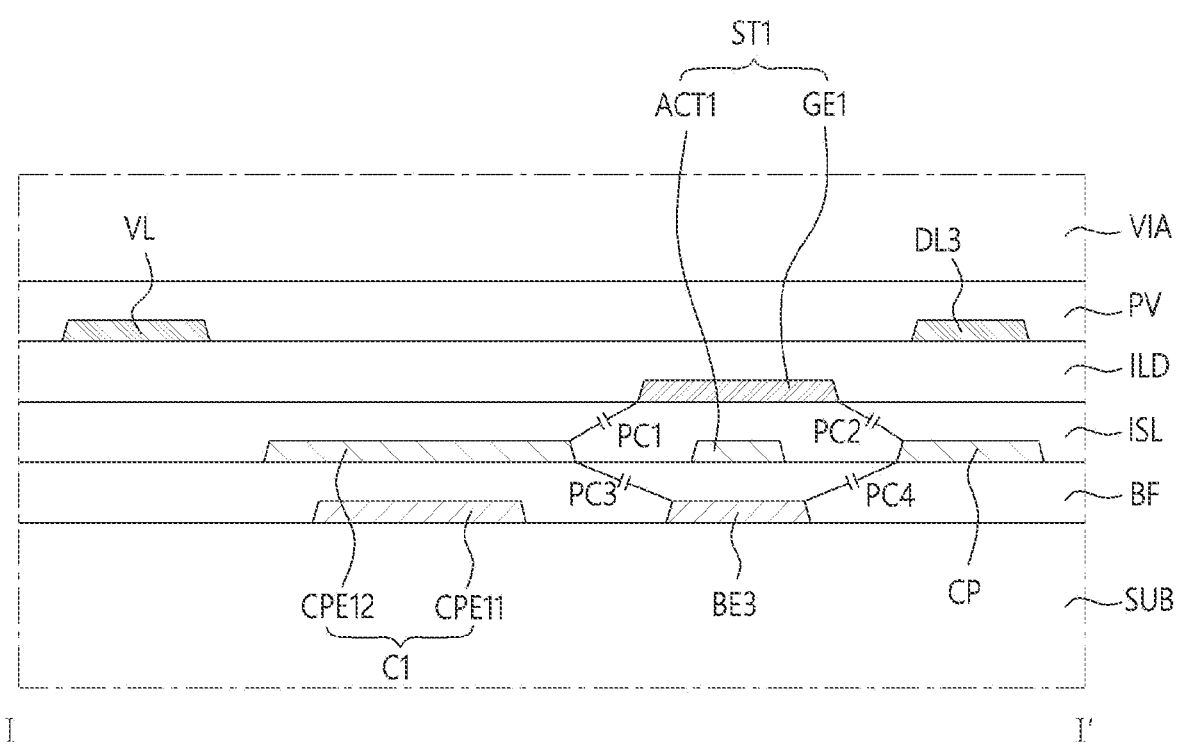
FIG. 10 is an example of a cross-sectional view taken along the line I-I' of FIG. 9.
Figure 11:
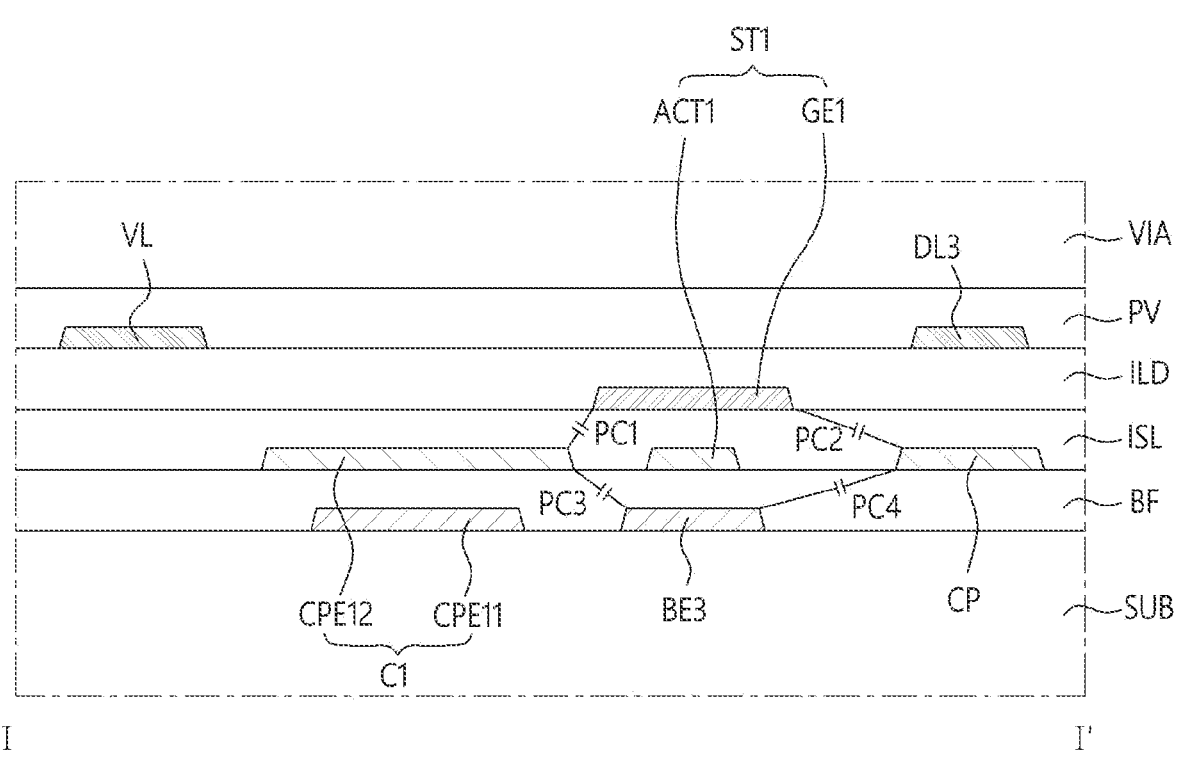
FIG. 11 is another example of a cross-sectional view taken along the line I-I' of FIG. 9.
Figure 12:
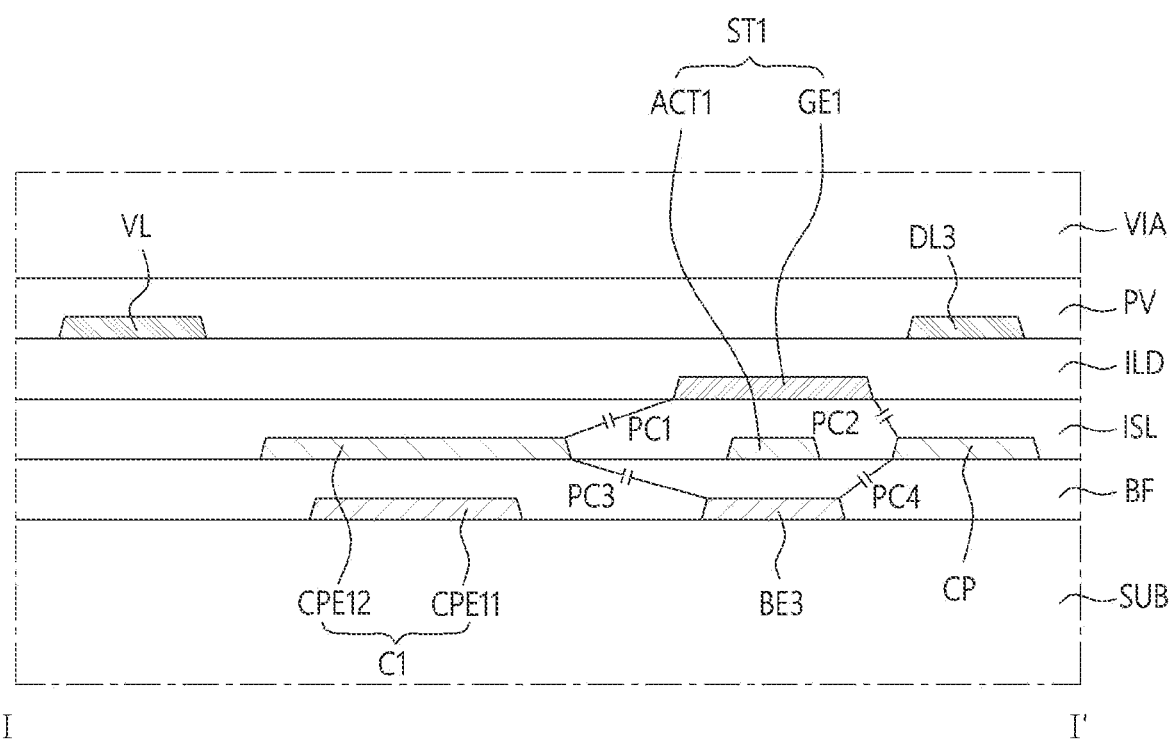
FIG. 12 is another example of a cross-sectional view taken along the line I-I' of FIG. 9.
Figure 13:
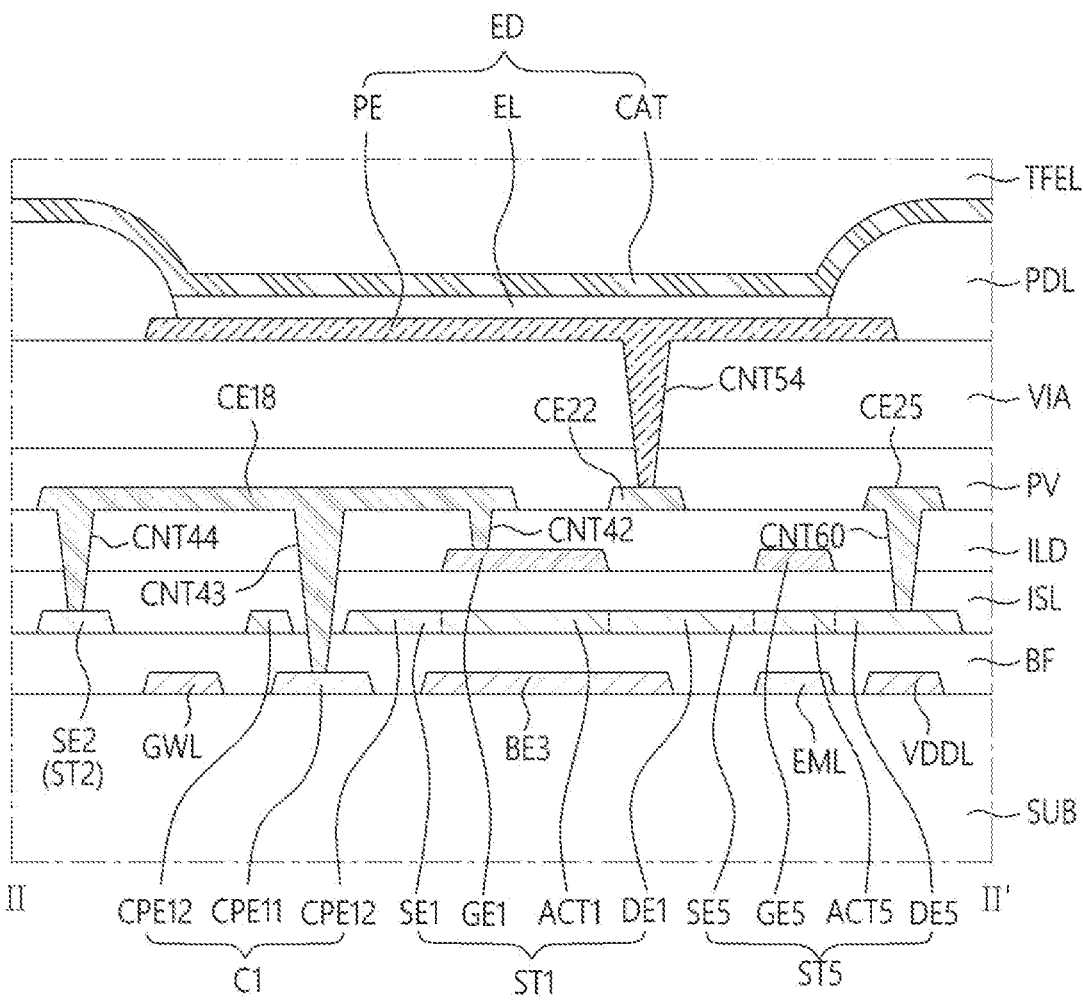
FIG. 13 is a cross-sectional view taken along the line II-II' of FIG. 9.

FIG. 6 is a plan view illustrating a pixel of the display device according to an embodiment. FIG. 7 is a plan view illustrating a first pixel illustrated in FIG. 6, FIG. 8 is a plan view illustrating a second pixel illustrated in FIG. 6, and FIG. 9 is a plan view illustrating a third pixel illustrated in FIG. 6. FIG. 10 is an example of a cross-sectional view taken along the line I-I' of FIG. 9. FIG. 11 is another example of a cross-sectional view taken along the line I-I' of FIG. 9. FIG. 12 is another example of a cross-sectional view taken along the line I-I' of FIG. 9. FIG. 13 is a cross-sectional view taken along the line II-II' of FIG. 9.

Referring to FIGS. 6 through 9, the display area DA may include a pixel SP, a voltage line VL, a first initialization voltage line VIL1, a reference voltage line VRL, a driving voltage line VDDL, a first horizontal initialization voltage line HVIL1, a second horizontal initialization voltage line HVIL2, a first gate line GWL, a second gate line GRL, a third gate line GIL, and an emission control line EML. The initialization voltage line VIL of FIG. 4 may correspond to the first horizontal initialization voltage line HVIL1 or the second horizontal initialization voltage line HVIL2.

Referring to FIGS. 10 through 13, the display panel 100 may include a substrate SUB, a first metal layer MTL1, a buffer layer BF, an active layer ACTL, a gate insulating layer ISL, a second metal layer MTL2, an interlayer insulating layer ILD, a third metal layer MTL3, a passivation layer PV, a via layer VIA, a pixel defining film PDL, a light emitting element ED, and an encapsulation layer TFEL. In some embodiments, the display panel 100 may further include a barrier layer (e.g., on the substrate SUB).

In FIG. 6, the pixel SP may include first to third pixels SP1, SP2, and SP3. A pixel circuit of the first pixel SP1, a pixel circuit of the second pixel SP2, and a pixel circuit of the third pixel SP3 may be arranged along the first direction (e.g., the X-axis direction). The data line DL may include first to third data lines DL1, DL2, and DL3. The first data line DL1 may supply a data voltage to the first pixel SP1, the second data line DL2 may supply a data voltage to the second pixel SP2, and the third data line DL3 may supply a data voltage to the third pixel SP3.

The first gate line GWL may be disposed at the first metal layer MTL1 and extend in the first direction (e.g., the X-axis direction). The first gate line GWL may be disposed on the upper side of a first capacitor C1 of each of the first to third pixels SP1, SP2, and SP3. Hereinafter, the right side refers to the X-axis direction, the left side refers to an opposite direction to the X-axis direction, the upper side refers to the Y-axis direction, and the lower side refers to an opposite direction to the Y-axis direction. In FIG. 7, the first gate line GWL may be electrically connected to a gate electrode GE2 of a second transistor ST2 of the first pixel SP1 through a second connection electrode CE2. The second connection electrode CE2 of the third metal layer MTL3 may be connected to the first gate line GWL of the first metal layer MTL1 through a fifth contact hole CNT5, and may be connected to the gate electrode GE2 of the second metal layer MTL2 through a sixth contact hole CNT6. In FIG. 8, the first gate line GWL may be electrically connected to a gate electrode GE2 of a second transistor ST2 of the second pixel SP2 through an eleventh connection electrode CE11. The eleventh connection electrode CE11 of the third metal layer MTL3 may be connected to the first gate line GWL of the first metal layer MTL1 through a twenty-seventh contact hole CNT27, and may be connected to the gate electrode GE2 of the second metal layer MTL2 through a twenty-eighth contact hole CNT28. In FIG. 9, the first gate line GWL may be electrically connected to a gate electrode GE2 of a second transistor ST2 of the third pixel SP3 through a nineteenth connection electrode CE19. The nineteenth connection electrode CE19 of the third metal layer MTL3 may be connected to the first gate line GWL of the first metal layer MTL1 through a forty-sixth contact hole CNT46, and may be connected to the gate electrode GE2 of the second metal layer MTL2 through a forty-seventh contact hole CNT47.

The second gate line GRL may be disposed at the first metal layer MTL1, and may extend in the first direction (e.g., the X-axis direction). The second gate line GRL may be disposed on the upper side of the first gate line GWL. In FIG. 7, the second gate line GRL may be electrically connected to a gate electrode GE3 of a third transistor ST3 of the first pixel SP1 through a third connection electrode CE3. The third connection electrode CE3 of the third metal layer MTL3 may be connected to the second gate line GRL of the first metal layer MTL1 through a ninth contact hole CNT9, and may be connected to the gate electrode GE3 of the second metal layer MTL2 through a tenth contact hole CNT10. In FIG. 8, the gate electrode GE3 of the third transistor ST3 of the first pixel SP1 and a gate electrode GE3 of a third transistor ST3 of the second pixel SP2 may be formed integrally with each other. Accordingly, the second gate line GRL may be electrically connected to the gate electrode GE3 of the third transistor ST3 of the second pixel SP2 through the third connection electrode CE3. In FIG. 9, the second gate line GRL may be electrically connected to a gate electrode GE3 of a third transistor ST3 of the third pixel SP3 through a twentieth connection electrode CE20. The twentieth connection electrode CE20 of the third metal layer MTL3 may be connected to the second gate line GRL of the first metal layer MTL1 through a forty-eighth contact hole CNT48, and may be connected to the gate electrode GE3 of the second metal layer MTL2 through a forty-ninth contact hole CNT49.

The reference voltage line VRL may be disposed at the first metal layer MTL1, and may extend in the first direction (e.g., the X-axis direction). The reference voltage line VRL may be disposed on the upper side of the second gate line GRL. The reference voltage line VRL may receive a reference voltage from a vertical reference voltage line. Here, the vertical reference voltage line may be disposed at a position of the first initialization voltage line VIL1 in a pixel SP disposed in another column, but is not limited thereto. In FIG. 7, the reference voltage line VRL may be electrically connected to a drain electrode DE3 of the third transistor ST3 of the first pixel SP1 through a fourth connection electrode CE4. The fourth connection electrode CE4 of the third metal layer MTL3 may be connected to the reference voltage line VRL of the first metal layer MTL1 through a seventh contact hole CNT7, and may be connected to the drain electrode DE3 of the active layer ACTL through an eighth contact hole CNT8. In FIG. 8, the reference voltage line VRL may be electrically connected to a drain electrode DE3 of the third transistor ST3 of the second pixel SP2 through a twelfth connection electrode CE12. The twelfth connection electrode CE12 of the third metal layer MTL3 may be connected to the reference voltage line VRL of the first metal layer MTL1 through a twenty-ninth contact hole CNT29, and may be connected to the drain electrode DE3 of the active layer ACTL through a thirtieth contact hole CNT30. In FIG. 9, the reference voltage line VRL may be electrically connected to a drain electrode DE3 of the third transistor ST3 of the third pixel SP3 through a twenty-first connection electrode CE21. The twenty-first connection electrode CE21 of the third metal layer MTL3 may be connected to the reference voltage line VRL of the first metal layer MTL1 through a fiftieth contact hole CNT50, and may be connected to the drain electrode DE3 of the second metal layer MTL2 through a fifty-first contact hole CNT51.

The emission control line EML may be disposed at the first metal layer MTL1, and may extend in the first direction (e.g., the X-axis direction). The emission control line EML may be disposed on the lower side of the first capacitor C1 of each of the first to third pixels SP1, SP2, and SP3. In FIG. 7, the emission control line EML may be electrically connected to a gate electrode GE5 of a fifth transistor ST5 of the first pixel SP1 through a ninth connection electrode CE9. The ninth connection electrode CE9 of the third metal layer MTL3 may be connected to the emission control line EML of the first metal layer MTL1 through a twentieth contact hole CNT20, and may be connected to the gate electrode GE5 of the second metal layer MTL2 through a twenty-first contact hole CNT21. In FIG. 8, the emission control line EML may be electrically connected to a gate electrode GE5 of a fifth transistor ST5 of the second pixel SP2 through a seventeenth connection electrode CE17. The seventeenth connection electrode CE17 of the third metal layer MTL3 may be connected to the emission control line EML of the first metal layer MTL1 through a fortieth contact hole CNT40, and may be connected to the gate electrode GE5 of the second metal layer MTL2 through a forty-first contact hole CNT41. In FIG. 9, the emission control line EML may be electrically connected to a gate electrode GE5 of a fifth transistor ST5 of the third pixel SP3 through a twenty-sixth connection electrode CE26. The twenty-sixth connection electrode CE26 of the third metal layer MTL3 may be connected to the emission control line EML of the first metal layer MTL1 through a sixty-first contact hole CNT61, and may be connected to the gate electrode GE5 of the second metal layer MTL2 through a sixty-second contact hole CNT62.

The driving voltage line VDDL may be disposed at the first metal layer MTL1, and may extend in the first direction (e.g., the X-axis direction). The driving voltage line VDDL may be disposed on the lower side of the emission control line EML. In FIG. 7, the driving voltage line VDDL may be electrically connected to a drain electrode DE5 of the fifth transistor ST5 of the first pixel SP1 through an eighth connection electrode CE8. The eighth connection electrode CE8 of the third metal layer MTL3 may be connected to the driving voltage line VDDL of the first metal layer MTL1 through an eighteenth contact hole CNT18, and may be connected to the drain electrode DE5 of the active layer ACTL through a nineteenth contact hole CNT19. In FIG. 8, the driving voltage line VDDL may be electrically connected to a drain electrode DE5 of the fifth transistor ST5 of the second pixel SP2 through a sixteenth connection electrode CE16. The sixteenth connection electrode CE16 of the third metal layer MTL3 may be connected to the driving voltage line VDDL of the first metal layer MTL1 through a thirty-eighth contact hole CNT38, and may be connected to the drain electrode DE5 of the active layer ACTL through a thirty-ninth contact hole CNT39. In FIG. 9, the driving voltage line VDDL may be electrically connected to a drain electrode DE5 of the fifth transistor ST5 of the third pixel SP3 through a twenty-fifth connection electrode CE25. The twenty-fifth connection electrode CE25 of the third metal layer MTL3 may be connected to the driving voltage line VDDL of the first metal layer MTL1 through a fifty-ninth contact hole CNT59, and may be connected to the drain electrode DE5 of the active layer ACTL through a sixtieth contact hole CN60.

The third gate line GIL may be disposed at the first metal layer MTL1, and may extend in the first direction (e.g., the X-axis direction). The third gate line GIL may be disposed on the lower side of the driving voltage line VDDL. In FIG. 7, the third gate line GIL may be electrically connected to a gate electrode GE4 of a fourth transistor ST4 of the first pixel SP1 through a seventh connection electrode CE7. The seventh connection electrode CE7 of the third metal layer MTL3 may be connected to the third gate line GIL of the first metal layer MTL1 through a fourteenth contact hole CNT14, and may be connected to the gate electrode GE4 of the second metal layer MTL2 through a fifteenth contact hole CNT15. In FIG. 8, the third gate line GIL may be electrically connected to a gate electrode GE4 of a fourth transistor ST4 of the second pixel SP2 through a fifteenth connection electrode CE15. The fifteenth connection electrode CE15 of the third metal layer MTL3 may be connected to the third gate line GIL of the first metal layer MTL1 through a thirty-fourth contact hole CNT34, and may be connected to the gate electrode GE4 of the second metal layer MTL2 through a thirty-fifth contact hole CNT35. In FIG. 9, the third gate line GIL may be electrically connected to a gate electrode GE4 of a fourth transistor ST4 of the third pixel SP3 through a twenty-fourth connection electrode CE24. The twenty-fourth connection electrode CE24 of the third metal layer MTL3 may be connected to the third gate line GIL of the first metal layer MTL1 through a fifty-fifth contact hole CNT55, and may be connected to the gate electrode GE4 of the second metal layer MTL2 through a fifty-sixth contact hole CNT56.

The first horizontal initialization voltage line HVIL1 may be disposed at the first metal layer MTL1, and may extend in the first direction (e.g., the X-axis direction). The first horizontal initialization voltage line HVIL1 may be disposed on the lower side of the third gate line GIL. The first horizontal initialization voltage line HVIL1 may be electrically connected to the first initialization voltage line VIL1 through a twenty-second contact hole CNT22. The first horizontal initialization voltage line HVIL1 may receive an initialization voltage from the first initialization voltage line VIL1. In FIG. 8, the first horizontal initialization voltage line HVIL1 may be electrically connected to a source electrode SE4 of the fourth transistor ST4 of the second pixel SP2 through a fourteenth connection electrode CE14. The fourteenth connection electrode CE14 of the third metal layer MTL3 may be connected to the first horizontal initialization voltage line HVIL1 of the first metal layer MTL1 through a thirty-sixth contact hole CNT36, and may be connected to the source electrode SE4 of the active layer ACTL through a thirty-seventh contact hole CNT37.

The second horizontal initialization voltage line HVIL2 may be disposed at the first metal layer MTL1, and may extend in the first direction (e.g., the X-axis direction). The second horizontal initialization voltage line HVIL2 may be disposed on the lower side of the first horizontal initialization voltage line HVIL1. The second horizontal initialization voltage line HVIL2 may receive an initialization voltage from a second initialization voltage line. Here, the second initialization voltage line may be disposed at a position of the first initialization voltage line VIL1 in a pixel SP disposed in another column, but is not limited thereto. In FIG. 7, the second horizontal initialization voltage line HVIL2 may be electrically connected to a source electrode SE4 of the fourth transistor ST4 of the first pixel SP1 through a sixth connection electrode CE6. The sixth connection electrode CE6 of the third metal layer MTL3 may be connected to the second horizontal initialization voltage line HVIL2 of the first metal layer MTL1 through a sixteenth contact hole CNT16, and may be connected to the source electrode SE4 of the active layer ACTL through a seventeenth contact hole CNT17. In FIG. 9, the second horizontal initialization voltage line HVIL2 may be electrically connected to a source electrode SE4 of the fourth transistor ST4 of the third pixel SP3 through a twenty-third connection electrode CE23. The twenty-third connection electrode CE23 of the third metal layer MTL3 may be connected to the second horizontal initialization voltage line HVIL2 of the first metal layer MTL1 through a fifty-seventh contact hole CNT57, and may be connected to the source electrode SE4 of the active layer ACTL through a fifty-eighth contact hole CNT58.

The first data line DL1 may be disposed at the third metal layer MTL3, and may extend in the second direction (e.g., the Y-axis direction). The first data line DL1 may be disposed on the left side of the pixel circuit of the first pixel SP1. In FIG. 7, the first data line DL1 may be connected to a drain electrode DE2 of the second transistor ST2 of the first pixel SP1 through a fourth contact hole CNT4. The first data line DL1 may overlap with a compensation pattern CP of the active layer ACTL. The compensation pattern CP may be formed integrally with the drain electrode DE5 of the fifth transistor ST5. Accordingly, the compensation pattern CP may receive a driving voltage from the driving voltage line VDDL.

The second data line DL2 may be disposed at the third metal layer MTL3, and may extend in the second direction (e.g., the Y-axis direction). The second data line DL2 may be disposed on the right side of the pixel circuit of the second pixel SP2. In FIG. 8, the second data line DL2 may be connected to a drain electrode DE2 of the second transistor ST2 of the second pixel SP2 through a twenty-sixth contact hole CNT26. The second data line DL2 may overlap with a compensation pattern CP of the active layer ACTL. The compensation pattern CP may be formed integrally with the drain electrode DE5 of the fifth transistor ST5. Accordingly, the compensation pattern CP may receive a driving voltage from the driving voltage line VDDL.

The third data line DL3 may be disposed at the third metal layer MTL3, and may extend in the second direction (e.g., the Y-axis direction). The third data line DL3 may be disposed on the right side of the pixel circuit of the third pixel SP3. In FIG. 9, the third data line DL3 may be connected to a drain electrode DE2 of the second transistor ST2 of the third pixel SP3 through a fifty-fifth contact hole CNT45. The third data line DL3 may overlap with a compensation pattern CP of the active layer ACTL. The compensation pattern CP may be formed integrally with the drain electrode DE5 of the fifth transistor ST5. Accordingly, the compensation pattern CP may receive a driving voltage from the driving voltage line VDDL.

The first initialization voltage line VIL1 may be disposed at the third metal layer MTL3, and may extend in the second direction (e.g., the Y-axis direction). The first initialization voltage line VIL1 may be disposed between the pixel circuit of the first pixel SP1 and the pixel circuit of the second pixel SP2. In a pixel disposed in another column, a second initialization voltage line may be disposed at a position of the first initialization voltage line VIL1. In a pixel disposed in still another column, the vertical reference voltage line may be disposed at a position of the first initialization voltage line VIL1.

The voltage line VL may be disposed at the third metal layer MTL3, and may extend in the second direction (e.g., the Y-axis direction). The voltage line VL may be disposed between the second data line DL2 and the pixel circuit of the third pixel SP3. For example, the voltage line VL may include a high potential line or the low potential line VSSL (e.g., see FIG. 4). When the voltage line VL is the high potential line, the voltage line VL may be electrically connected to the driving voltage line VDDL to supply the high potential voltage to the driving voltage line VDDL. When the voltage line VL is the low potential line VSSL, the voltage line VL may supply the low potential voltage to the second electrode of the light emitting element ED.

In FIG. 7, the pixel circuit of the first pixel SP1 may include first to fifth transistors ST1, ST2, ST3, ST4, and ST5, and first and second capacitors C1 and C2.

The first transistor ST1 of the first pixel SP1 may include a semiconductor region ACT1, a gate electrode GE1, the drain electrode DE1, and a source electrode SE1. The semiconductor region ACT1 of the first transistor ST1 may be disposed at the active layer ACTL, and may overlap with the gate electrode GE1 of the first transistor ST1. The active layer ACTL may be disposed on the buffer layer BF covering the first metal layer MTL1.

The gate electrode GE1 of the first transistor ST1 may be disposed at the second metal layer MTL2. The gate electrode GE1 of the first transistor ST1 may be electrically connected to a first capacitor electrode CPE11 of the first capacitor C1 through a first connection electrode CE1. The first connection electrode CE1 of the third metal layer MTL3 may be connected to the gate electrode GE1 of the second metal layer MTL2 through a first contact hole CNT1, and may be connected to the first capacitor electrode CPE11 of the first metal layer MTL1 through a second contact hole CNT2. The first connection electrode CE1 may be connected to a source electrode SE2 of the second transistor ST2 and a source electrode SE3 of the third transistor ST3 through a third contact hole CNT3.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The drain electrode DE1 of the first transistor ST1 may be formed integrally with a source electrode SE5 of the fifth transistor ST5. The source electrode SE1 of the first transistor ST1 may be formed integrally with a second capacitor electrode CPE12 of the first capacitor C1.

A first bias electrode BE1 may be disposed at the first metal layer MTL1, and may overlap with the first transistor ST1. The first bias electrode BE1 may be electrically connected to the second capacitor electrode CPE12 of the first capacitor C1 through a fifth connection electrode CE5. The fifth connection electrode CE5 of the third metal layer MTL3 may be connected to the second capacitor electrode CPE12 of the active layer ACTL through an eleventh contact hole CNT11, may be connected to the first bias electrode BE1 of the first metal layer MTL1 through a twelfth contact hole CNT12, and may be connected to the light emitting element ED through a thirteenth contact hole CNT13. Here, the thirteenth contact hole CNT13 may be formed to penetrate through the via layer VIA and the passivation layer PV.

The second transistor ST2 of the first pixel SP1 may include a semiconductor region ACT2, the gate electrode GE2, the drain electrode DE2, and the source electrode SE2. The semiconductor region ACT2 of the second transistor ST2 may be disposed at the active layer ACTL, and may overlap with the gate electrode GE2 of the second transistor ST2. The gate electrode GE2 of the second transistor ST2 may be disposed at the second metal layer MTL2. The gate electrode GE2 of the second transistor ST2 may be electrically connected to the first gate line GWL through the second connection electrode CE2.

The drain electrode DE2 and the source electrode SE2 of the second transistor ST2 may become conductors by heat-treating the active layer ACTL. The first data line DL1 may be connected to the drain electrode DE2 of the second transistor ST2 through the fourth contact hole CNT4. The drain electrode DE2 of the second transistor ST2 may receive the data voltage of the first pixel SP1 from the first data line DL1. The source electrode SE2 of the second transistor ST2 may be electrically connected to the gate electrode GE1 of the first transistor ST1 and the first capacitor electrode CPE11 of the first capacitor C1 through the first connection electrode CE1.

The third transistor ST3 of the first pixel SP1 may include a semiconductor region ACT3, the gate electrode GE3, the drain electrode DE3, and the source electrode SE3. The semiconductor region ACT3 of the third transistor ST3 may be disposed at the active layer ACTL, and may overlap with the gate electrode GE3 of the third transistor ST3. The gate electrode GE3 of the third transistor ST3 may be disposed at the second metal layer MTL2. The gate electrode GE3 of the third transistor ST3 may be electrically connected to the second gate line GRL through the third connection electrode CE3.

The drain electrode DE3 and the source electrode SE3 of the third transistor ST3 may become conductors by heat-treating the active layer ACTL. The reference voltage line VRL may be electrically connected to the drain electrode DE3 of the third transistor ST3 through the fourth connection electrode CE4. The source electrode SE3 of the third transistor ST3 may be electrically connected to the gate electrode GE1 of the first transistor ST1 and the first capacitor electrode CPE11 of the first capacitor C1 through the first connection electrode CE1. The source electrode SE3 of the third transistor ST3 may be formed integrally with the source electrode SE2 of the second transistor ST2, but is not limited thereto.

The fourth transistor ST4 of the first pixel SP1 may include a semiconductor region ACT4, the gate electrode GE4, a drain electrode DE4, and the source electrode SE4. The semiconductor region ACT4 of the fourth transistor ST4 may be disposed at the active layer ACTL, and may overlap with the gate electrode GE4 of the fourth transistor ST4. The gate electrode GE4 of the fourth transistor ST4 may be disposed at the second metal layer MTL2. The gate electrode GE4 of the fourth transistor ST4 may be electrically connected to the third gate line GIL through the seventh connection electrode CE7.

The drain electrode DE4 and the source electrode SE4 of the fourth transistor ST4 may become conductors by heat-treating the active layer ACTL. The drain electrode DE4 of the fourth transistor ST4 may be formed integrally with a second capacitor electrode CPE22 of the second capacitor C2. The second capacitor electrode CPE22 of the second capacitor C2 may be formed integrally with the second capacitor electrode CPE12 of the first capacitor C1. The second capacitor electrode CPE12 of the first capacitor C1 may be formed integrally with the source electrode SE1 of the first transistor ST1. Accordingly, the drain electrode DE4 of the fourth transistor ST4, the second capacitor electrode CPE22 of the second capacitor C2, the second capacitor electrode CPE12 of the first capacitor C1, and the source electrode SE1 of the first transistor ST1 may be formed integrally with each other. The source electrode SE4 of the fourth transistor ST4 may be electrically connected to the second horizontal initialization voltage line HVIL2 through the sixth connection electrode CE6.

A first capacitor electrode CPE21 of the second capacitor C2 may be a portion of the driving voltage line VDDL. The second capacitor C2 may maintain or substantially maintain a potential difference between the first capacitor electrode CPE21 and the second capacitor electrode CPE22. The first capacitor C1 and the second capacitor C2 may be spaced apart from each other with the emission control line EML interposed therebetween.

The fifth transistor ST5 of the first pixel SP1 may include a semiconductor region ACT5, the gate electrode GE5, the drain electrode DE5, and the source electrode SE5. The semiconductor region ACT5 of the fifth transistor ST5 may be disposed at the active layer ACTL, and may overlap with the gate electrode GE5 of the fifth transistor ST5. The gate electrode GE5 of the fifth transistor ST5 may be disposed at the second metal layer MTL2. The gate electrode GE5 of the fifth transistor ST5 may be electrically connected to the emission control line EML through the ninth connection electrode CE9.

The drain electrode DE5 and the source electrode SE5 of the fifth transistor ST5 may become conductors by heat-treating the active layer ACTL. The driving voltage line VDDL may be electrically connected to the drain electrode DE5 of the fifth transistor ST5 through the eighth connection electrode CE8. The source electrode SE5 of the fifth transistor ST5 may be formed integrally with the drain electrode DE1 of the first transistor ST1.

In FIG. 8, the pixel circuit of the second pixel SP2 may include first to fifth transistors ST1, ST2, ST3, ST4, and ST5, and first and second capacitors C1 and C2.

The first transistor ST1 of the second pixel SP2 may include a semiconductor region ACT1, a gate electrode GE1, a drain electrode DE1, and a source electrode SE1. The semiconductor region ACT1 of the first transistor ST1 may be disposed at the active layer ACTL, and may overlap with the gate electrode GE1 of the first transistor ST1.

The gate electrode GE1 of the first transistor ST1 may be disposed at the second metal layer MTL2. The gate electrode GE1 of the first transistor ST1 may be electrically connected to a first capacitor electrode CPE11 of the first capacitor C1 through a tenth connection electrode CE10. The tenth connection electrode CE10 of the third metal layer MTL3 may be connected to the gate electrode GE1 of the second metal layer MTL2 through a twenty-third contact hole CNT23, and may be connected to the first capacitor electrode CPE11 of the first metal layer MTL1 through a twenty-fourth contact hole CNT24. The tenth connection electrode CE10 may be connected to a source electrode SE2 of the second transistor ST2 and a source electrode SE3 of the third transistor ST3 through a twenty-fifth contact hole CNT25.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The drain electrode DE1 of the first transistor ST1 may be formed integrally with a source electrode SE5 of the fifth transistor ST5. The source electrode SE1 of the first transistor ST1 may be formed integrally with a second capacitor electrode CPE12 of the first capacitor C1.

A second bias electrode BE2 may be disposed at the first metal layer MTL1, and may overlap with the first transistor ST1. The second bias electrode BE2 may be electrically connected to the second capacitor electrode CPE12 of the first capacitor C1 through a thirteenth connection electrode CE13. The thirteenth connection electrode CE13 of the third metal layer MTL3 may be connected to the second capacitor electrode CPE12 of the active layer ACTL through a thirty-first contact hole CNT31, may be connected to the second bias electrode BE2 of the first metal layer MTL1 through a thirty-second contact hole CNT32, and may be connected to the light emitting element ED through a thirty-third contact hole CNT33. Here, the thirty-third contact hole CNT33 may be formed to penetrate through the via layer VIA and the passivation layer PV.

The second transistor ST2 of the second pixel SP2 may include a semiconductor region ACT2, the gate electrode GE2, the drain electrode DE2, and the source electrode SE2. The semiconductor region ACT2 of the second transistor ST2 may be disposed at the active layer ACTL, and may overlap with the gate electrode GE2 of the second transistor ST2. The gate electrode GE2 of the second transistor ST2 may be disposed at the second metal layer MTL2. The gate electrode GE2 of the second transistor ST2 may be electrically connected to the first gate line GWL through the eleventh connection electrode CE11.

The drain electrode DE2 and the source electrode SE2 of the second transistor ST2 may become conductors by heat-treating the active layer ACTL. The second data line DL2 may be connected to the drain electrode DE2 of the second transistor ST2 through the twenty-sixth contact hole CNT26. The drain electrode DE2 of the second transistor ST2 may receive the data voltage of the second pixel SP2 from the second data line DL2. The source electrode SE2 of the second transistor ST2 may be electrically connected to the gate electrode GE1 of the first transistor ST1 and the first capacitor electrode CPE11 of the first capacitor C1 through the tenth connection electrode CE10.

The third transistor ST3 of the second pixel SP2 may include a semiconductor region ACT3, the gate electrode GE3, the drain electrode DE3, and the source electrode SE3. The semiconductor region ACT3 of the third transistor ST3 may be disposed at the active layer ACTL, and may overlap with the gate electrode GE3 of the third transistor ST3. The gate electrode GE3 of the third transistor ST3 may be disposed at the second metal layer MTL2. The gate electrode GE3 of the third transistor ST3 of the first pixel SP1 and the gate electrode GE3 of the third transistor ST3 of the second pixel SP2 may be formed integrally with each other. Accordingly, the gate electrode GE3 of the third transistor ST3 of the second pixel SP2 may be electrically connected to the second gate line GRL through the third connection electrode CE3 (e.g., see FIG. 7).

The drain electrode DE3 and the source electrode SE3 of the third transistor ST3 may become conductors by heat-treating the active layer ACTL. The reference voltage line VRL may be electrically connected to the drain electrode DE3 of the third transistor ST3 through the twelfth connection electrode CE12. The source electrode SE3 of the third transistor ST3 may be electrically connected to the gate electrode GE1 of the first transistor ST1 and the first capacitor electrode CPE11 of the first capacitor C1 through the tenth connection electrode CE10. The source electrode SE3 of the third transistor ST3 may be formed integrally with the source electrode SE2 of the second transistor ST2, but is not limited thereto.

The fourth transistor ST4 of the second pixel SP2 may include a semiconductor region ACT4, the gate electrode GE4, a drain electrode DE4, and the source electrode SE4. The semiconductor region ACT4 of the fourth transistor ST4 may be disposed at the active layer ACTL, and may overlap with the gate electrode GE4 of the fourth transistor ST4. The gate electrode GE4 of the fourth transistor ST4 may be disposed at the second metal layer MTL2. The gate electrode GE4 of the fourth transistor ST4 may be electrically connected to the third gate line GIL through the fifteenth connection electrode CE15.

The drain electrode DE4 and the source electrode SE4 of the fourth transistor ST4 may become conductors by heat-treating the active layer ACTL. The drain electrode DE4 of the fourth transistor ST4 may be formed integrally with a second capacitor electrode CPE22 of the second capacitor C2. The second capacitor electrode CPE22 of the second capacitor C2 may be formed integrally with the second capacitor electrode CPE12 of the first capacitor C1. The second capacitor electrode CPE12 of the first capacitor C1 may be formed integrally with the source electrode SE1 of the first transistor ST1. Accordingly, the drain electrode DE4 of the fourth transistor ST4, the second capacitor electrode CPE22 of the second capacitor C2, the second capacitor electrode CPE12 of the first capacitor C1, and the source electrode SE1 of the first transistor ST1 may be formed integrally with each other. The source electrode SE4 of the fourth transistor ST4 may be electrically connected to the first horizontal initialization voltage line HVIL1 through the fourteenth connection electrode CE14.

A first capacitor electrode CPE21 of the second capacitor C2 may be a portion of the driving voltage line VDDL. The second capacitor C2 may maintain or substantially maintain a potential difference between the first capacitor electrode CPE21 and the second capacitor electrode CPE22. The first capacitor C1 and the second capacitor C2 may be spaced apart from each other with the emission control line EML interposed therebetween.

The fifth transistor ST5 of the second pixel SP2 may include a semiconductor region ACT5, the gate electrode GE5, the drain electrode DE5, and the source electrode SE5. The semiconductor region ACT5 of the fifth transistor ST5 may be disposed at the active layer ACTL, and may overlap with the gate electrode GE5 of the fifth transistor ST5. The gate electrode GE5 of the fifth transistor ST5 may be disposed at the second metal layer MTL2. The gate electrode GE5 of the fifth transistor ST5 may be electrically connected to the emission control line EML through the seventeenth connection electrode CE17.

The drain electrode DE5 and the source electrode SE5 of the fifth transistor ST5 may become conductors by heat-treating the active layer ACTL. The driving voltage line VDDL may be electrically connected to the drain electrode DE5 of the fifth transistor ST5 through the sixteenth connection electrode CE16. The source electrode SE5 of the fifth transistor ST5 may be formed integrally with the drain electrode DE1 of the first transistor ST1.

In FIG. 9, the pixel circuit of the third pixel SP3 may include first to fifth transistors ST1, ST2, ST3, ST4, and ST5, and first and second capacitors C1 and C2.

The first transistor ST1 of the third pixel SP3 may include a semiconductor region ACT1, a gate electrode GE1, the drain electrode DE1, and a source electrode SE1. The semiconductor region ACT1 of the first transistor ST1 may be disposed at the active layer ACTL, and may overlap with the gate electrode GE1 of the first transistor ST1.

The gate electrode GE1 of the first transistor ST1 may be disposed at the second metal layer MTL2. The gate electrode GE1 of the first transistor ST1 may be electrically connected to a first capacitor electrode CPE11 of the first capacitor C1 through an eighteenth connection electrode CE18. The eighteenth connection electrode CE18 of the third metal layer MTL3 may be connected to the gate electrode GE1 of the second metal layer MTL2 through a forty-second contact hole CNT42, and may be connected to the first capacitor electrode CPE11 of the first metal layer MTL1 through a forty-third contact hole CNT43. The eighteenth connection electrode CE18 may be connected to a source electrode SE2 of the second transistor ST2 and a source electrode SE3 of the third transistor ST3 through a forty-fourth contact hole CNT44.

The drain electrode DE1 and the source electrode SE1 of the first transistor ST1 may become conductors by heat-treating the active layer ACTL. The drain electrode DE1 and the source electrode SE1 may become conductors as N-type semiconductors, but are not limited thereto. The drain electrode DE1 of the first transistor ST1 may be formed integrally with a source electrode SE5 of the fifth transistor ST5. The source electrode SE1 of the first transistor ST1 may be formed integrally with a second capacitor electrode CPE12 of the first capacitor C1.

A third bias electrode BE3 may be disposed at the first metal layer MTL1, and may overlap with the first transistor ST1. The third bias electrode BE3 may be electrically connected to the second capacitor electrode CPE12 of the first capacitor C1 through a twenty-second connection electrode CE22. The twenty-second connection electrode CE22 of the third metal layer MTL3 may be connected to the second capacitor electrode CPE12 of the active layer ACTL through a fifty-second contact hole CNT52, may be connected to the third bias electrode BE3 of the first metal layer MTL1 through a fifty-third contact hole CNT53, and may be connected to the light emitting element ED through a fifty-fourth contact hole CNT54. Here, the fifty-fourth contact hole CNT54 may be formed to penetrate through the via layer VIA and the passivation layer PV.

The second transistor ST2 of the third pixel SP3 may include a semiconductor region ACT2, the gate electrode GE2, the drain electrode DE2, and the source electrode SE2. The semiconductor region ACT2 of the second transistor ST2 may be disposed at the active layer ACTL, and may overlap with the gate electrode GE2 of the second transistor ST2. The gate electrode GE2 of the second transistor ST2 may be disposed at the second metal layer MTL2. The gate electrode GE2 of the second transistor ST2 may be electrically connected to the first gate line GWL through the nineteenth connection electrode CE19.

The drain electrode DE2 and the source electrode SE2 of the second transistor ST2 may become conductors by heat-treating the active layer ACTL. The third data line DL3 may be connected to the drain electrode DE2 of the second transistor ST2 through the forty-fifth contact hole CNT45. The drain electrode DE2 of the second transistor ST2 may receive the data voltage of the third pixel SP3 from the third data line DL3. The source electrode SE2 of the second transistor ST2 may be electrically connected to the gate electrode GE1 of the first transistor ST1 and the first capacitor electrode CPE11 of the first capacitor C1 through the eighteenth connection electrode CE18.

The third transistor ST3 of the third pixel SP3 may include a semiconductor region ACT3, the gate electrode GE3, the drain electrode DE3, and the source electrode SE3. The semiconductor region ACT3 of the third transistor ST3 may be disposed at the active layer ACTL, and may overlap with the gate electrode GE3 of the third transistor ST3. The gate electrode GE3 of the third transistor ST3 may be disposed at the second metal layer MTL2. The gate electrode GE3 of the third transistor ST3 may be electrically connected to the second gate line GRL through the twentieth connection electrode CE20.

The drain electrode DE3 and the source electrode SE3 of the third transistor ST3 may become conductors by heat-treating the active layer ACTL. The reference voltage line VRL may be electrically connected to the drain electrode DE3 of the third transistor ST3 through the twenty-first connection electrode CE21. The source electrode SE3 of the third transistor ST3 may be electrically connected to the gate electrode GE1 of the first transistor ST1 and the first capacitor electrode CPE11 of the first capacitor C1 through the eighteenth connection electrode CE18. The source electrode SE3 of the third transistor ST3 may be formed integrally with the source electrode SE2 of the second transistor ST2, but is not limited thereto.

The fourth transistor ST4 of the third pixel SP3 may include a semiconductor region ACT4, the gate electrode GE4, a drain electrode DE4, and the source electrode SE4. The semiconductor region ACT4 of the fourth transistor ST4 may be disposed at the active layer ACTL, and may overlap with the gate electrode GE4 of the fourth transistor ST4. The gate electrode GE4 of the fourth transistor ST4 may be disposed at the second metal layer MTL2. The gate electrode GE4 of the fourth transistor ST4 may be electrically connected to the third gate line GIL through the twenty-fourth connection electrode CE24.

The drain electrode DE4 and the source electrode SE4 of the fourth transistor ST4 may become conductors by heat-treating the active layer ACTL. The drain electrode DE4 of the fourth transistor ST4 may be formed integrally with a second capacitor electrode CPE22 of the second capacitor C2. The second capacitor electrode CPE22 of the second capacitor C2 may be formed integrally with the second capacitor electrode CPE12 of the first capacitor C1. The second capacitor electrode CPE12 of the first capacitor C1 may be formed integrally with the source electrode SE1 of the first transistor ST1. Accordingly, the drain electrode DE4 of the fourth transistor ST4, the second capacitor electrode CPE22 of the second capacitor C2, the second capacitor electrode CPE12 of the first capacitor C1, and the source electrode SE1 of the first transistor ST1 may be formed integrally with each other. The source electrode SE4 of the fourth transistor ST4 may be electrically connected to the second horizontal initialization voltage line HVIL2 through the twenty-third connection electrode CE23.

A first capacitor electrode CPE21 of the second capacitor C2 may be a portion of the driving voltage line VDDL. The second capacitor C2 may maintain or substantially maintain a potential difference between the first capacitor electrode CPE21 and the second capacitor electrode CPE22. The first capacitor C1 and the second capacitor C2 may be spaced apart from each other with the emission control line EML interposed therebetween.

The fifth transistor ST5 of the third pixel SP3 may include a semiconductor region ACT5, the gate electrode GE5, the drain electrode DE5, and the source electrode SE5. The semiconductor region ACT5 of the fifth transistor ST5 may be disposed at the active layer ACTL, and may overlap with the gate electrode GE5 of the fifth transistor ST5. The gate electrode GE5 of the fifth transistor ST5 may be disposed at the second metal layer MTL2. The gate electrode GE5 of the fifth transistor ST5 may be electrically connected to the emission control line EML through the twenty-sixth connection electrode CE26.

The drain electrode DE5 and the source electrode SE5 of the fifth transistor ST5 may become conductors by heat-treating the active layer ACTL. The driving voltage line VDDL may be electrically connected to the drain electrode DE5 of the fifth transistor ST5 through the twenty-fifth connection electrode CE25. The source electrode SE5 of the fifth transistor ST5 may be formed integrally with the drain electrode DE1 of the first transistor ST1.

In FIGS. 10 through 13, the substrate SUB may be a base substrate or a base member. The substrate SUB may be a flexible substrate that may be bent, folded, and/or rolled. As an example, the substrate SUB may include a glass material or a metal material, but is not limited thereto. As another example, the substrate SUB may include a polymer resin, such as polyimide (PI).

The first metal layer MTL1 may be disposed on the substrate SUB. The first metal layer MTL1 may include the third bias electrode BE3, the first capacitor electrode CPE11 of the first capacitor C1, the first gate line GWL, the emission control line EML, and the driving voltage line VDDL. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The buffer layer BF may be disposed on the first metal layer MTL1 and the substrate SUB. The buffer layer BF may include an inorganic insulating material capable of preventing or substantially preventing permeation of air and/or moisture. The buffer layer BF may include at least one of a silicon nitride layer, a silicon oxynitride layer, a silicon oxide layer, a titanium oxide layer, an aluminum oxide layer, or an amorphous silicon layer, but is not limited thereto.

The active layer ACTL may be disposed on the buffer layer BF. The active layer ACTL may include the second capacitor electrode CPE12 of the first capacitor C1, the semiconductor region ACT1, the drain electrode DE1, and the source electrode SE1 of the first transistor ST1, the source electrode SE2 of the second transistor ST2, the semiconductor region ACT5, the drain electrode DE5, and the source electrode SE5 of the fifth transistor ST5, and the compensation pattern CP. The first capacitor C1 may maintain or substantially maintain a potential difference between the first capacitor electrode CPE11 and the second capacitor electrode CPE12. The semiconductor region ACT1 of the first transistor ST1 may overlap with the gate electrode GE1 of the first transistor ST1. The semiconductor region ACT5 of the fifth transistor ST5 may overlap with the gate electrode GE5 of the fifth transistor ST5. The compensation pattern CP may overlap with the third data line DL3.

The gate insulating layer ISL may be disposed on the active layer ACTL and the buffer layer BF. The gate insulating layer ISL may insulate the gate electrode GE1 and the semiconductor region ACT1 of the first transistor ST1 from each other. The gate insulating layer ISL may include at least one of a silicon nitride layer, a silicon oxynitride layer, a silicon oxide layer, a titanium oxide layer, an aluminum oxide layer, or an amorphous silicon layer, but is not limited thereto.

The second metal layer MTL2 may be disposed on the gate insulating layer ISL. The second metal layer MTL2 may include the gate electrode GE1 of the first transistor ST1 and the gate electrode GE5 of the fifth transistor ST5. The second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The interlayer insulating layer ILD may be disposed on the second metal layer MTL2 and the gate insulating layer ISL. The interlayer insulating layer ILD may insulate the second metal layer MTL2 and the third metal layer MTL3 from each other. The interlayer insulating layer ILD may include at least one of a silicon nitride layer, a silicon oxynitride layer, a silicon oxide layer, a titanium oxide layer, an aluminum oxide layer, or an amorphous silicon layer, but is not limited thereto.

The third metal layer MTL3 may be disposed on the interlayer insulating layer ILD. The third metal layer MTL3 may include the voltage line VL, the third data line DL3, the eighteenth connection electrode CE18, the twenty-second connection electrode CE22, and the twenty-fifth connection electrode CE25. The eighteenth connection electrode CE18 may electrically connect the source electrode SE2 of the second transistor ST2, the first capacitor electrode CPE11 of the first capacitor C1, and the gate electrode GE1 of the first transistor ST1 to each other. The twenty-second connection electrode CE22 may be connected to a pixel electrode PE of the light emitting element ED. The twenty-fifth connection electrode CE25 may be connected to the drain electrode DE5 of the fifth transistor ST5. The third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The passivation layer PV may be disposed on the third metal layer MTL3 and the interlayer insulating layer ILD. The passivation layer PV may protect the pixel circuits of the pixels SP. The passivation layer PV may include at least one of a silicon nitride layer, a silicon oxynitride layer, a silicon oxide layer, a titanium oxide layer, an aluminum oxide layer, or an amorphous silicon layer, but is not limited thereto.

The via layer VIA may be disposed on the passivation layer PV. For example, the via layer VIA may include an organic insulating material, such as polyimide (PI), but is not limited thereto.

The pixel defining film PDL may be disposed on the via layer VIA. The pixel defining film PDL may define a plurality of emission areas or a plurality of opening areas. The pixel defining film PDL may allow the pixel electrodes PE of the plurality of pixels SP to be spaced apart and insulated from each other.

The light emitting element ED may be disposed on the via layer VIA. The light emitting element ED of each of the plurality of pixels SP may include a pixel electrode PE, a light emitting layer EL, and a common electrode CAT. The pixel electrode PE may be disposed on the via layer VIA. The pixel electrode PE may overlap with one of the plurality of emission areas defined by the pixel defining film PDL. For example, the pixel electrode PE may receive the driving current from the pixel circuit of the third pixel SP3 through the twenty-second connection electrode CE22.

The light emitting layer EL may be disposed on the pixel electrode PE. For example, the light emitting layer EL may be an organic light emitting layer including (e.g., made of) an organic material, but is not limited thereto. In a case where the light emitting layer EL is the organic light emitting layer, when the pixel circuit of the pixel SP applies a suitable voltage (e.g., a predetermined voltage) to the pixel electrode PE, and the common electrode CAT receives a common voltage or a cathode voltage, holes and electrons may move to the organic light emitting layer EL through a hole transporting layer and an electron transport layering, respectively, and may be combined with each other in the organic light emitting layer EL to emit light.

The common electrode CAT may be disposed on the light emitting layer EL. For example, the common electrode CAT may not be divided for each of the plurality of pixels SP, and may be implemented in the form of an electrode that is common to all of the pixels SP. The common electrode CAT may be disposed on the light emitting layers EL in the plurality of emission areas, and may be disposed on the pixel defining film PDL in areas other than the plurality of emission areas.

The encapsulation layer TFEL may be disposed on the common electrodes CAT to cover the plurality of light emitting elements ED. The encapsulation layer TFEL may include at least one inorganic film to prevent or substantially prevent oxygen and/or moisture from permeating into the plurality of light emitting elements ED. The encapsulation layer TFEL may include at least one organic film to protect the plurality of light emitting elements ED from foreign materials, such as dust.

In FIG. 10, the semiconductor region ACT1 of the first transistor ST1 may be disposed between the second capacitor electrode CPE12 of the first capacitor C1 and the compensation pattern CP. For example, a distance between the semiconductor region ACT1 and the second capacitor electrode CPE12 may be the same or substantially the same as a distance between the semiconductor region ACT1 and the compensation pattern CP. A distance between the gate electrode GE1 and the second capacitor electrode CPE12 may be the same or substantially the same as a distance between the gate electrode GE1 and the compensation pattern CP. A first parasitic capacitor PC1 may be formed between the gate electrode GE1 and the second capacitor electrode CPE12, and a second parasitic capacitor PC2 may be formed between the gate electrode GE1 and the compensation pattern CP. A distance between the third bias electrode BE3 and the second capacitor electrode CPE12 may be the same or substantially the same as a distance between the third bias electrode BE3 and the compensation pattern CP. A third parasitic capacitor PC3 may be formed between the third bias electrode BE3 and the second capacitor electrode CPE12, and a fourth parasitic capacitor PC4 may be formed between the third bias electrode BE3 and the compensation pattern CP.

In FIG. 11, the gate electrode GE1 may be disposed more adjacent to (e.g., closer to) the second capacitor electrode CPE12 than that of the gate electrode GE1 of FIG. 10. The distance between the gate electrode GE1 and the second capacitor electrode CPE12 may be smaller than the distance between the gate electrode GE1 and the compensation pattern CP. The first parasitic capacitor PC1 of FIG. 11 may be greater than the first parasitic capacitor PC1 of FIG. 10, and the second parasitic capacitor PC2 of FIG. 11 may be smaller than the second parasitic capacitor PC2 of FIG. 10. The sum of the first and second parasitic capacitors PC1 and PC2 of FIG. 11 may be the same or substantially the same as the sum of the first and second parasitic capacitors PC1 and PC2 of FIG. 10.

The third bias electrode BE3 may be disposed more adjacent to (e.g., closer to) the second capacitor electrode CPE12 than that of the third bias electrode BE3 of FIG. 10. The distance between the third bias electrode BE3 and the second capacitor electrode CPE12 may be smaller than the distance between the third bias electrode BE3 and the compensation pattern CP. The third parasitic capacitor PC3 of FIG. 11 may be greater than the third parasitic capacitor PC3 of FIG. 10, and the fourth parasitic capacitor PC4 of FIG. 11 may be smaller than the fourth parasitic capacitor PC4 of FIG. 10. The sum of the third and fourth parasitic capacitors PC3 and PC4 of FIG. 11 may be the same or substantially the same as the sum of the third and fourth parasitic capacitors PC3 and PC4 of FIG. 10.

Therefore, according to one or more embodiments, the display device 10 includes the compensation pattern CP disposed on one side of the semiconductor region ACT1 of the first transistor ST1, such that a parasitic capacitance around the first transistor ST1 may be kept constant, even though the first transistor ST1 or the third bias electrode BE3 is misaligned, and thus, a threshold voltage Vth of the first transistor ST1 may be stably maintained.

In FIG. 12, the gate electrode GE1 may be disposed more adjacent to (e.g., closer to) the compensation pattern CP than that of the gate electrode GE1 of FIG. 10. The distance between the gate electrode GE1 and the compensation pattern CP may be smaller than the distance between the gate electrode GE1 and the second capacitor electrode CPE12. The second parasitic capacitor PC2 of FIG. 12 may be greater than the second parasitic capacitor PC2 of FIG. 10, and the first parasitic capacitor PC1 of FIG. 12 may be smaller than the first parasitic capacitor PC1 of FIG. 10. The sum of the first and second parasitic capacitors PC1 and PC2 of FIG. 12 may be the same or substantially the same as the sum of the first and second parasitic capacitors PC1 and PC2 of FIG. 10.

The third bias electrode BE3 may be disposed more adjacent to (e.g., closer to) the compensation pattern CP than that of the third bias electrode BE3 of FIG. 10. The distance between the third bias electrode BE3 and the compensation pattern CP may be smaller than the distance between the third bias electrode BE3 and the second capacitor electrode CPE12. The fourth parasitic capacitor PC4 of FIG. 12 may be greater than the fourth parasitic capacitor PC4 of FIG. 10, and the third parasitic capacitor PC3 of FIG. 12 may be smaller than the third parasitic capacitor PC3 of FIG. 10. The sum of the third and fourth parasitic capacitors PC3 and PC4 of FIG. 12 may be the same or substantially the same as the sum of the third and fourth parasitic capacitors PC3 and PC4 of FIG. 10.

Therefore, according to one or more embodiments, the display device 10 includes the compensation pattern CP disposed on one side of the semiconductor region ACT1 of the first transistor ST1, such that a parasitic capacitance around the first transistor ST1 may be kept constant, even though the first transistor ST1 or the third bias electrode BE3 is misaligned, and thus, a threshold voltage Vth of the first transistor ST1 may be stably maintained.

Figure 14:
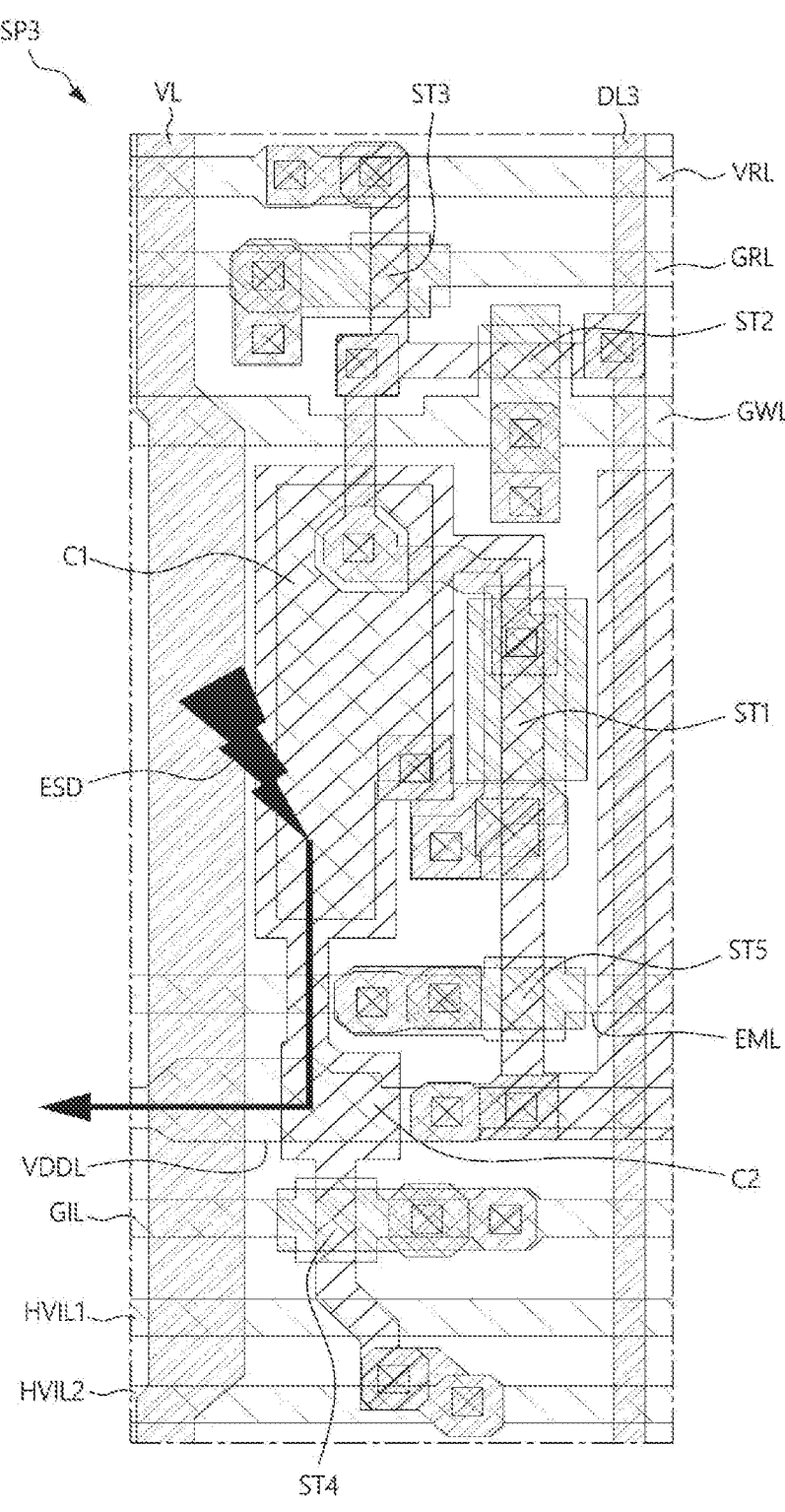
FIG. 14 is a view illustrating a process of discharging static electricity flowing into a first capacitor of the third pixel in the display device according to an embodiment.

FIG. 14 is a view illustrating a process of discharging static electricity flowing into a first capacitor of the third pixel in the display device according to an embodiment.

Referring to FIG. 14, static electricity ESD may flow into the first capacitor C1 of the third pixel SP3. The static electricity ESD flowing into the first capacitor C1 may be discharged through the second capacitor C2 and the driving voltage line VDDL. Accordingly, the display device 10 may stably eliminate, minimize, or reduce the static electricity ESD flowing into the first capacitor C1 to protect the pixel circuit.

Figure 15:
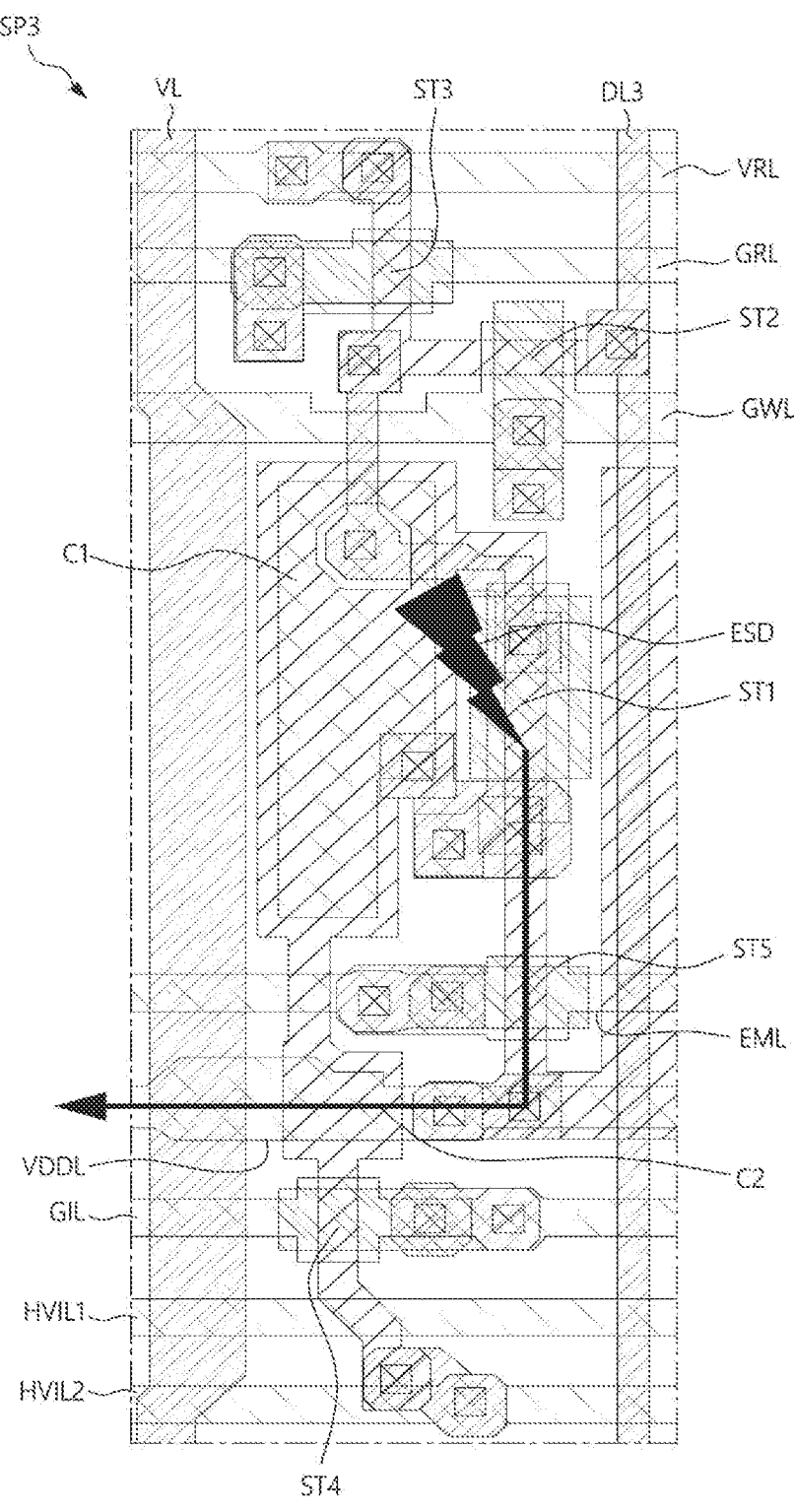
FIG. 15 is a view illustrating a process of discharging static electricity flowing into a first transistor of the third pixel in the display device according to an embodiment.

FIG. 15 is a view illustrating a process of discharging static electricity flowing into a first transistor of the third pixel in the display device according to an embodiment.

Referring to FIG. 15, static electricity ESD may flow into the first transistor ST1 of the third pixel SP3. The static electricity ESD flowing into the first transistor ST1 may be discharged through the fifth transistor ST5, the second capacitor C2, and the driving voltage line VDDL. Accordingly, the display device 10 may stably eliminate, minimize, or reduce the static electricity ESD flowing into the first transistor ST1 to protect the pixel circuit.

Figure 16:
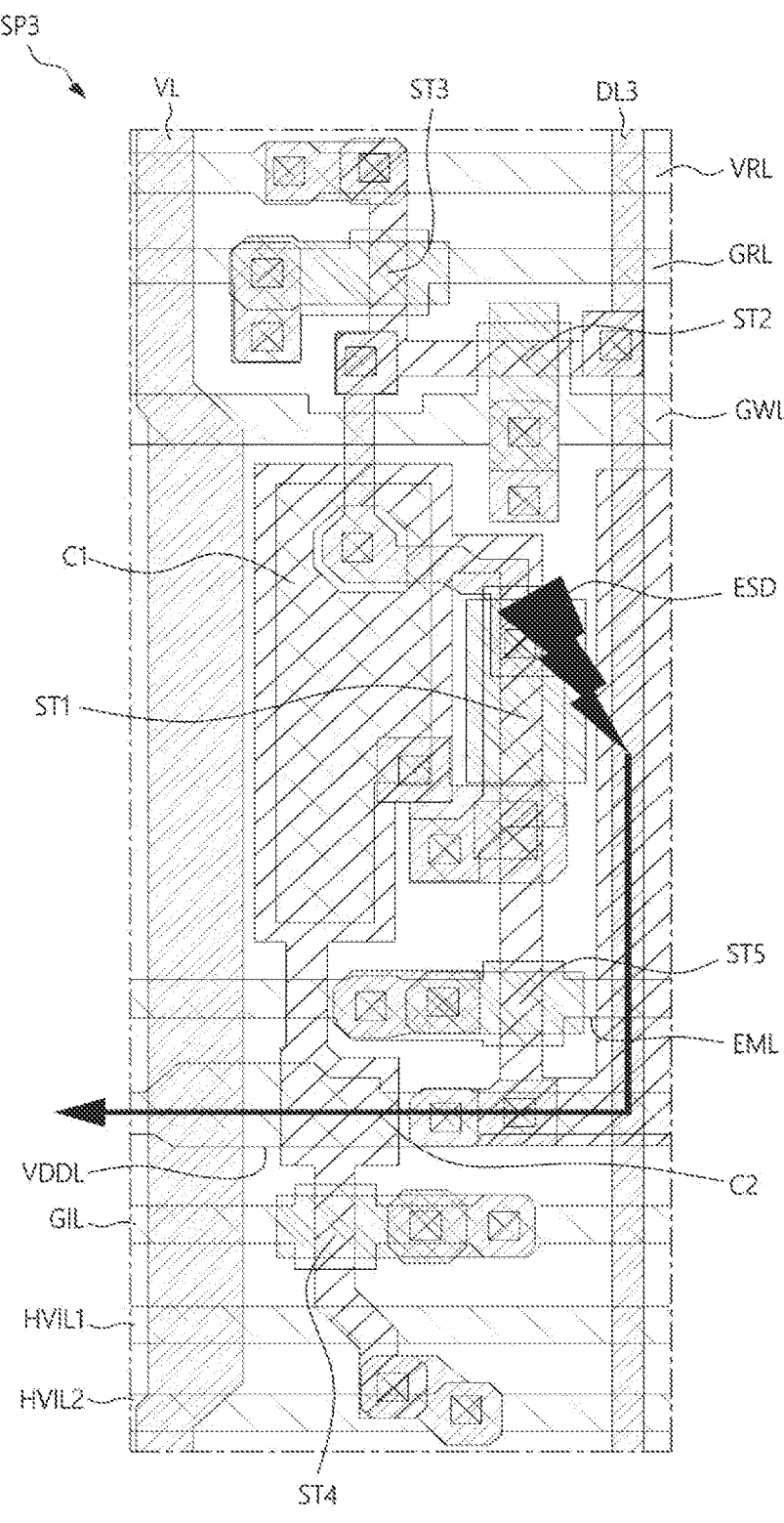
FIG. 16 is a view illustrating a process of discharging static electricity flowing into a third data line in the display device according to an embodiment.

FIG. 16 is a view illustrating a process of discharging static electricity flowing into a third data line in the display device according to an embodiment.

Referring to FIG. 16, static electricity ESD may flow into the third data line DL3. The static electricity ESD flowing into the third data line DL3 may be discharged through the second capacitor C2 and the driving voltage line VDDL. Accordingly, the display device 10 may stably eliminate, minimize, or reduce the static electricity ESD flowing into the third data line DL3 to protect the pixel circuit.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a substrate;
a first metal layer on the substrate;
an active layer on the first metal layer;
a second metal layer on the active layer;
a third metal layer on the second metal layer;
a first transistor comprising:
    a semiconductor region at the active layer;
    a drain electrode on a first side of the semiconductor region;
    a source electrode on a second side of the semiconductor region opposite to the first side; and
    a gate electrode at the second metal layer;
a first capacitor comprising:
    a first capacitor electrode at the first metal layer, and electrically connected to the gate electrode of the first transistor; and
    a second capacitor electrode integral with the source electrode of the first transistor, and on a third side of the semiconductor region of the first transistor; and
a compensation pattern at the active layer, and on a fourth side of the semiconductor region of the first transistor opposite to the third side.

2. The display device of claim 1, further comprising a data line extending in a first direction at the third metal layer, and overlapping with the compensation pattern.

3. The display device of claim 2, further comprising a second transistor comprising:
a semiconductor region at the active layer;
a drain electrode at the active layer, and electrically connected to the data line;
a source electrode at the active layer, and electrically connected to the gate electrode of the first transistor; and
a gate electrode at the second metal layer, and electrically connected to a first gate line.

4. The display device of claim 2, further comprising:
a reference voltage line at the first metal layer, and extending in a second direction crossing the first direction; and
a second gate line at the first metal layer, and on a first side of the reference voltage line.

5. The display device of claim 4, further comprising a third transistor comprising:
a semiconductor region at the active layer;
a drain electrode at the active layer, and electrically connected to the reference voltage line;
a source electrode at the active layer, and electrically connected to the gate electrode of the first transistor; and
a gate electrode at the second metal layer, and electrically connected to the second gate line.

6. The display device of claim 2, further comprising:
an initialization voltage line extending in a second direction crossing the first direction at the first metal layer; and
a third gate line on a second side of the initialization voltage line at the first metal layer.

7. The display device of claim 6, further comprising a fourth transistor comprising:
a semiconductor region at the active layer;
a drain electrode at the active layer, and electrically connected to the second capacitor electrode of the first capacitor;
a source electrode at the active layer, and electrically connected to the initialization voltage line; and
a gate electrode at the second metal layer, and electrically connected to the third gate line.

8. The display device of claim 2, further comprising:
a driving voltage line extending in a second direction crossing the first direction at the first metal layer; and
an emission control line on a second side of the driving voltage line at the first metal layer.

9. The display device of claim 8, further comprising a fifth transistor comprising:
a semiconductor region at the active layer;
a drain electrode at the active layer, and electrically connected to the driving voltage line;
a source electrode at the active layer, and electrically connected to the drain electrode of the first transistor; and
a gate electrode at the second metal layer, and electrically connected to the emission control line.

10. The display device of claim 8, wherein the compensation pattern is electrically connected to the driving voltage line.

11. A display device comprising:
a substrate;
a driving voltage line extending in a first direction at a first metal layer on the substrate;
a first transistor on a first side of the driving voltage line, and comprising:

a semiconductor region, a drain electrode, and a source electrode at an active layer on the first metal layer; and a gate electrode at a second metal layer on the first metal layer;

a first capacitor on a second side of the first transistor perpendicular to a first side of the first transistor, and comprising:

a first capacitor electrode at the first metal layer, and electrically connected to the gate electrode of the first transistor; and a second capacitor electrode at the active layer, and electrically connected to the source electrode of the first transistor;

a voltage line on a second side of the first capacitor at a third metal layer on the second metal layer; and a compensation pattern on a third side of the first transistor opposite to the second side of the first transistor at the active layer, and electrically connected to the driving voltage line.

12. The display device of claim 11, further comprising a data line extending in a second direction crossing the first direction at the third metal layer, and overlapping with the compensation pattern.

13. The display device of claim 12, further comprising:

a first gate line on the first side of the first transistor at the first metal layer; and a second transistor configured to receive a first gate signal from the first gate line, and electrically connect the data line and the gate electrode of the first transistor to each other.

14. The display device of claim 13, further comprising:

a second gate line on a first side of the first gate line at the first metal layer; and a reference voltage line on a first side of the second gate line at the first metal layer.

15. The display device of claim 14, further comprising a third transistor configured to receive a second gate signal from the second gate line, and electrically connect the reference voltage line and the gate electrode of the first transistor to each other.

16. The display device of claim 11, further comprising:

a third gate line on a fourth side of the driving voltage line opposite to the first side of the driving voltage line at the first metal layer; and an initialization voltage line on a fourth side of the third gate line at the first metal layer.

17. The display device of claim 16, further comprising a fourth transistor configured to receive a third gate signal from the third gate line, and electrically connect the source electrode of the first transistor and the initialization voltage line to each other.

18. The display device of claim 11, further comprising:

an emission control line between the driving voltage line and the first transistor at the first metal layer; and a fifth transistor configured to receive an emission signal from the emission control line, and electrically connect the driving voltage line and the drain electrode of the first transistor to each other.

19. The display device of claim 11, further comprising a second capacitor comprising:

a first capacitor electrode as a portion of the driving voltage line; and a second capacitor electrode at the active layer, and integral with the second capacitor electrode of the first capacitor.

20. The display device of claim 11, further comprising a bias electrode at the first metal layer, overlapping with the first transistor, and electrically connected to the second capacitor electrode of the first capacitor.

* * * * *